United States Patent
Bukkems et al.

(10) Patent No.: US 10,006,608 B2
(45) Date of Patent: Jun. 26, 2018

(54) FLAT LIGHTING DEVICE

(71) Applicant: PHILIPS LIGHTING HOLDING B.V., Eindhoven (NL)

(72) Inventors: Peter Johannes Martinus Bukkems, Deurne (NL); Peter Rijskamp, Venray (NL); Simon Eme Kadijk, Veldhoven (NL); Johannes Petrus Maria Ansems, Hulsel (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 118 days.

(21) Appl. No.: 14/649,244

(22) PCT Filed: Dec. 5, 2013

(86) PCT No.: PCT/IB2013/060652
§ 371 (c)(1),
(2) Date: Jun. 3, 2015

(87) PCT Pub. No.: WO2014/087357
PCT Pub. Date: Jun. 12, 2014

(65) Prior Publication Data
US 2016/0003417 A1 Jan. 7, 2016

Related U.S. Application Data

(60) Provisional application No. 61/733,476, filed on Dec. 5, 2012.

(30) Foreign Application Priority Data

Dec. 5, 2012 (EP) .................................... 12195700
Mar. 19, 2013 (EP) .................................... 13159889
Mar. 19, 2013 (EP) .................................... 13159895

(51) Int. Cl.
F21V 1/00 (2006.01)
F21V 7/22 (2018.01)
(Continued)

(52) U.S. Cl.
CPC .................. F21V 7/22 (2013.01); F21K 9/23 (2016.08); F21K 9/232 (2016.08); F21K 9/238 (2016.08);
(Continued)

(58) Field of Classification Search
CPC ............. F21Y 2101/00; F21Y 2103/10; F21Y 2103/30; F21Y 2103/33
(Continued)

(56) References Cited

U.S. PATENT DOCUMENTS 6,626,554 B2* 9/2003 Rincover .................. F21L 4/00
362/186
7,261,437 B2* 8/2007 Coushaine ............ F21S 48/212
362/234
(Continued)

FOREIGN PATENT DOCUMENTS

DE 102011006749 A1 10/2012
EP 2058584 A1 5/2009
(Continued)

Primary Examiner — Daniel St Cyr
(74) Attorney, Agent, or Firm — Akarsh P. Belagodu

(57) ABSTRACT

The present invention relates to a flat lighting device (1) comprising a carrier (2) including a thermally conductive layer (7), at least one solid state light source (3) arranged on a front side of the carrier (2), and an electrically insulating cover member (5a, 5b) in thermal contact with said front side and a back side opposite said front side. The cover member (5a, 5b) is adapted to transfer heat from said carrier (2) out of the lighting device. The cover member (5a, 5b) comprises an optical structure (4) arranged on the carrier (2) in front of the at least one light source (3) and adapted to
(Continued)

direct the light emitted by the at least one solid state light source (3).

28 Claims, 29 Drawing Sheets

(51) Int. Cl.
| | |
|---|---|
| F21V 29/503 | (2015.01) |
| H05K 1/02 | (2006.01) |
| H05K 1/18 | (2006.01) |
| F21V 29/506 | (2015.01) |
| F21V 29/70 | (2015.01) |
| F21V 23/00 | (2015.01) |
| F21K 9/23 | (2016.01) |
| F21K 9/232 | (2016.01) |
| F21K 9/60 | (2016.01) |
| F21K 9/61 | (2016.01) |
| F21V 29/74 | (2015.01) |
| F21V 29/80 | (2015.01) |
| F21V 5/04 | (2006.01) |
| F21V 15/01 | (2006.01) |
| F21V 19/00 | (2006.01) |
| F21K 9/238 | (2016.01) |
| F21K 9/90 | (2016.01) |
| F21V 3/02 | (2006.01) |
| F21Y 105/10 | (2016.01) |
| F21Y 115/10 | (2016.01) |
| F21Y 107/90 | (2016.01) |

(52) U.S. Cl.
CPC .............. *F21K 9/60* (2016.08); *F21K 9/61* (2016.08); *F21V 5/04* (2013.01); *F21V 15/01* (2013.01); *F21V 19/003* (2013.01); *F21V 19/006* (2013.01); *F21V 23/003* (2013.01); *F21V 29/503* (2015.01); *F21V 29/506* (2015.01); *F21V 29/70* (2015.01); *F21V 29/74* (2015.01); *F21V 29/80* (2015.01); *H05K 1/0209* (2013.01); *H05K 1/189* (2013.01); F21K 9/90 (2013.01); F21V 3/02 (2013.01); F21Y 2105/10 (2016.08); F21Y 2107/90 (2016.08); F21Y 2115/10 (2016.08); H05K 2201/10106 (2013.01)

(58) Field of Classification Search
USPC ........................................ 362/236, 294, 373
See application file for complete search history.

(56) References Cited

U.S. PATENT DOCUMENTS

| | | | |
|---|---|---|---|
| 7,461,951 B2* | 12/2008 | Chou | ........................ F21K 9/00 |
| | | | 362/227 |
| 7,976,182 B2* | 7/2011 | Ribarich | .............. H05K 1/0206 |
| | | | 362/221 |
| 2007/0121326 A1 | 5/2007 | Nall et al. | |
| 2009/0103296 A1 | 4/2009 | Harbers et al. | |
| 2010/0182788 A1 | 7/2010 | Luo et al. | |
| 2011/0032708 A1 | 2/2011 | Johnston et al. | |
| 2011/0080740 A1 | 4/2011 | Allen et al. | |
| 2011/0215699 A1 | 9/2011 | Le et al. | |
| 2012/0069570 A1 | 3/2012 | Marinus et al. | |
| 2012/0074827 A1 | 3/2012 | Hsieh et al. | |
| 2012/0175667 A1 | 7/2012 | Golle et al. | |

FOREIGN PATENT DOCUMENTS

| | | |
|---|---|---|
| FR | 2926926 A1 | 7/2009 |
| GB | 2367883 A | 4/2002 |
| JP | 2003209288 A | 7/2003 |
| WO | 2011107925 A1 | 9/2011 |
| WO | 2012095758 A2 | 7/2012 |
| WO | 2013056516 A1 | 4/2013 |
| WO | 2014087363 A1 | 6/2014 |
| WO | 2014087366 A1 | 6/2014 |

* cited by examiner

FLAT LIGHTING DEVICE

CROSS-REFERENCE TO PRIOR APPLICATIONS

This application is the U.S. National Phase application under 35 U.S.C. § 371 of International Application No. PCT/IB13/060652, filed on Dec. 5, 2013, which claims the benefit of U.S. Provisional Patent Application No. 61/733, 476, filed on Dec. 5, 2012 and also European Patent Application No. 12195700.5 filed Dec. 5, 2012, also European Patent Application No. filed 13159895.5 filed Mar. 19, 2013 and European Patent Application No. 13159889.8 filed Mar. 19, 2013. These applications are hereby incorporated by reference herein.

FIELD OF THE INVENTION

The present invention relates to a flat lighting device comprising solid state light sources, and more specifically to a flat lamp.

BACKGROUND OF THE INVENTION

Conventional LED lamps comprise a printed circuit board with LEDs arranged on it. The printed circuit board is arranged in a horizontal manner when arranging the LED lamp in a standing position, or, if defining a longitudinal axis of the LED lamp, arranged with an angle to the longitudinal axis. In front of the printed circuit board in a light exit direction, a plastic or glass bulb is arranged in order to manipulate the emitted light from the LEDs, and to protect components inside the lamp. Below the printed circuit board, a number of components are arranged with the main purpose of spreading and transferring the heat generated by the LEDs. These may be a heat spreader, heat fins, a metal housing and a cap. Such LED lamp hence comprises a large number of components in order to perform all tasks of the lamp such as generating and distributing light, transferring heat, protect the electric connections and provide a fire enclosure.

An alternative LED lamp is disclosed in WO2011/107925A1, wherein a printed circuit board with a LED is arranged on a reflector. Such solution decreases the amount of components in the lamp. However, such lamp has its limitations in optical performance. Further, such an arrangement may not dissipate sufficient heat for realizing high lumen lamps.

Consequently, there is a need for a lamp that in a protective manner further increases the effectiveness in terms of optical and thermal properties.

SUMMARY OF THE INVENTION

It is an object of the present invention to provide a lighting device that provides an effective light generation and distribution.

According to a first aspect of the invention, this is achieved by a lighting device comprising a solid state light source, a carrier on which said solid state light source is arranged, such that an amount of heat generated by the light source is transmitted into the carrier. Further, a cover member is disposed on the carrier, whereby the light source is arranged between the carrier and a light-transmitting part of the cover member, such that a thermal interface exists between the carrier and the cover member and the thermal interface is arranged to transmit there through a majority of the heat transmitted into the carrier from the light source, and the light-transmitting part of the cover member comprises an optical structure adapted to direct emitted light from the solid state light source out of the lighting device.

It is recognized by the present invention that the desired optical properties of a lighting device can be achieved by providing the light-transmitting part of the cover by an optical structure that is arranged to direct the light from the solid state light source in a desired direction. In this way it is possible to obtain an angular dependent luminous intensity distribution which is compliant with customer requirements or with standardized light distributions.

In preferred embodiments, the cover member is formed of a transparent, translucent or tinted material and the light-transmitting part is formed as an integrated part of the cover member. This has the advantage that the number of components of the lighting device is reduced, enabling an easier manufacturing. Alternatively, the light-transmitting part is formed as a separate part from the cover member, rendering a broader choice of materials to be used for the light-transmitting part.

The light-transmitting parts are arranged in front of the solid state light sources and are functional for outputting the light through these light-transmitting parts. In contrast to these light-transmitting parts, the remainder of the cover member does not have to be transparent. Therefore, in case the light-transmitting part is formed as an integrated part of the cover member, the cover member may also be e.g. tinted leaving the light-transmitting parts transparent to a certain degree. In case the light-transmitting part is formed as a separate part of the cover member, the cover member may be e.g. tinted and the light-transmitting parts are formed as optical structures to be mounted to or by the cover member.

These optical structures may be chosen from the group of lenses, lightguides and scattering optics.

In addition, the lighting device may have additional solid state light sources and associated additional optical structures.

The optical structure may be designed to provide a non-symmetric luminous intensity distribution. In this way the optical structures of a lighting device with a plurality of solid state light sources may be optimized for each solid light source separately, in order to obtain the desired luminous intensity distribution of the lighting device.

In this aspect of this invention, it is realized that this lighting device may further comprise a connection member having a fixed position relative to the carrier for mechanically and electrically connecting the lighting device to a socket. The carrier is having a relatively large front side compared with its edge side and the solid state light source is arranged on the front side of the carrier. The cover member has an outer surface being a portion of the outside of the lighting device and has an inner surface, opposite to the outer surface, that is in thermal contact with the front side of the carrier, such that the thermal interface is formed.

In this embodiment the present invention is applied to make, for instance a lighting device that is suitable for replacing a conventional incandescent type of lamp also referred to as a retrofit lamp.

In a further embodiment, a second solid state light source is arranged on a back side of the carrier being opposite to the front side, a second cover member is disposed on the carrier, whereby the second light source is arranged between the carrier and a light-transmitting part of the second cover member, such that a thermal interface exists between the carrier and the second cover member, the second cover member having a second outer surface being a second portion of the outside of the lighting device and having a second inner surface being opposite to the second outer surface and being in thermal contact with the back side of the carrier, such that the second thermal interface is formed. In this embodiment the front side and the back side of the lighting device may be constructed in a similar way. When this is used a retrofit lamp can be obtained that emits light in both directions respective to the front side and back side. The solid state light sources arranged on both sides of the carrier can each be provided with an optical structure that is designed to fulfill the requirements for obtaining a desired luminous intensity distribution.

In a preferred embodiment the lighting device provides a substantially uniform luminous intensity distribution. In case the lighting device comprises a plurality of light sources the light distribution of each separate light source can be asymmetric. The design is such that the individual luminous intensity distributions add up to an overall luminous intensity distribution of the lighting device that is substantially uniform.

According to a first aspect of the invention, this and other objects are achieved by a lighting device comprising a planar carrier including a thermally conductive layer, at least one solid state light source arranged on a front side of the carrier, and an insulating cover member in thermal contact with said front side and a back side opposite said front side, and said cover member being adapted to transfer heat from said carrier out of the lighting device. The cover member comprises an optical structure arranged on the carrier in front of the at least one light source and adapted to direct the light emitted by the at least one solid state light source.

Such lighting device may thereby provide an effective heat transfer from the carrier and out of the arrangement with few parts and in a compact manner. Due to the thermal contact of the cover member with both sides of the carrier, a majority of the heat generated by the light sources may be transferred by the cover member. The cover member may be in direct contact with the carrier. The cover member may comprise an inner surface facing the carrier. The inner surface may be in direct contact with the front and back side of the carrier. The lighting device may further provide a cost efficient manufacturing process due the few parts. The optical structure may be designed to direct the light from the light source through the cover member in a desired way. The light source and the carrier may together provide the functions of converting power, generating light and spreading the heat generated. The cover member and lens may provide the functions of manipulating/directing the light from the light source, transferring the heat from the carrier and providing electrical insulation and fire enclosure of the arrangement. The cover member may further have a protective purpose, protecting the carrier and light source from external damage. The lighting device may be arranged in a cap for use in an electrical socket, or integrated in a luminaire. The carrier may comprise two flat sides, the front side and the back side. The carrier may further be planar. Light sources may be arranged on either one or both sides of the carrier. The cover member may be arranged such that it is in thermal contact with both sides of the carrier. The cover member may be arranged to be in thermal contact with a substantial part of the carrier, such as at least half of the front side and back side of the carrier. The cover member may be formed of a glass material, a plastic material, a ceramic material or the like. A normal plastic material for a cover member may provide sufficient thermal properties to provide a heat transfer function from the carrier. To further improve the thermal properties of the cover member, the cover member may be made of a thermal plastic material. The carrier may comprise a heat spreading layer for spreading the heat generated by the light sources over a large area of the carrier. The heat spreading layer may for instance be a copper layer or an aluminum layer. The heat spreading layer may further be adapted to spread heat from the front side to the back side of the carrier, and vice versa. In one embodiment, the carrier may comprise more than one heat spreading layer. Further, in one embodiment, the carrier may comprise an aluminum sheet metal provided with electrical connections of FR-4 or CEM-1 material. The aluminum sheet metal may thereby form the heat spreading layer and electrical interconnections.

In one embodiment, the cover member may be arranged to enclose the carrier and the at least one solid state light source. Wherein the cover member encloses the carrier, and is in contact with both the front side and the back side of the carrier, the cover member may provide the required stiffness to the arrangement in order to hold the carrier. The carrier may then be made very thin, for instance as thin as 0.2 mm. Since the cover member encloses both front and back side of the carrier, the carrier will anyway be held in place. The carrier thereby does not need to provide stability to the arrangement, but may be focused on heat spreading, holding the light source and providing electrical tracks to the light source. By enclosing the carrier, the cover member may be in thermal contact with a large part of the carrier, such as at least ninety percent of an external surface of the carrier. The cover member may further be in thermal contact with edge surfaces of the carrier. The edge surfaces may together with the front side and back side form a total external surface of the carrier. The heat transfer from the carrier may thereby be improved. The cover member may have an inner side and an outer side, wherein the inner side is in contact with the carrier and adapted to transfer heat from the inner side to the outer side.

The cover member may in one embodiment be formed of a transparent material and the lens may be formed as an integrated part of the cover member. The cover member and the lens may be formed of the same material in one piece. The material of the cover member including the lens may thereby provide both the thermal properties for heat transfer and the optical properties of the lens, directing the light from the light source. The material may be transparent or translucent due to the optical properties. The cover member and lens may be molded in one common piece. Alternatively, the cover member may be formed of a thermally conductive material, and as a separate part from the optical structure which is formed of a transparent or translucent material. The lens may be formed of a material different from the material of the cover member. The material of the cover member may be designed for providing good heat transfer properties, such as a material with low thermal resistivity. The cover member may be non-transparent. The different material of the lens may be designed for good optical performance in directing the light from the light source. The lens may however have some thermal conductivity, i.e. contribute to the heat transfer from the carrier. An inner side surface of the lens, which may be in contact with the carrier, may be designed to maximize the heat transfer from the carrier to the lens. Such inner side surface may be flat.

In one embodiment, the cover member may comprise a first and a second cover part adapted to be attached to each other and to be in contact with the front side and the back side of the carrier respectively. The cover member may be in two parts, thereby facilitating the manufacturing and the assembly of the lighting device. The two parts may comprise fastening means arranged to mate with each other in order to be fixed the two parts to each other. Such fastening means may be a snap coupling, glue, screws, ultrasonic welding or the like. The carrier may be sandwiched between the two cover parts when assembled. The first cover part may thereby be in thermal contact with the front side of the carrier, and the second cover part may be in thermal contact with the back side of the carrier. Further the first cover part may comprise a protrusion adapted to extend through an opening in the carrier to align the carrier inside the cover member. To align the carrier inside the cover member, the cover member may comprise a protrusion extending through an opening in the carrier. The position of the carrier relative to the cover member may thereby be fixed. The protrusion on the first cover part may be adapted to mate with corresponding means on the second cover part, thereby fixing the two parts to each other and sandwiching the carrier in between.

In a further embodiment, the at least one solid state light source may comprise a plurality of solid state light sources arranged with a distance to each other, or arranged in subgroups with a distance between each subgroup, and wherein the an optical structure may comprise a number of lenses equal to the number of separated solid state light sources or the number of separated subgroups of solid state light sources. To provide a lighting device which provides a light output of a certain amount, a plurality of light sources may be arranged on the carrier. The plurality of lenses may each be designed to direct light from one light source or a subgroup of light sources arranged together. By spreading the light sources or subgroups of light sources on the carrier, the heat generated by the light sources may further be spread along the extension area of the carrier. This may improve the heat spreading and heat transfer function of the arrangement due to a more efficient heat spreading in the carrier, which provides a more efficient heat transfer by the cover member. By providing a number of lenses equal to the number of light sources or subgroups of light sources, the total light output from the lighting device may be highly controllable. The lens for a specific light source or subgroup of light sources may be specially designed for that light source or subgroup, and may be different from another lens for another light source or subgroup. For instance, the light output may be directed in certain directions by each lens such that the total light output is optimized for a specific purpose. Further, each light source or subgroup may be controlled by a driver or controller to provide a light output unique for that specific light source or subgroup.

In one embodiment, the lighting device may have a longitudinal axis and the carrier may extend in a first plane in parallel with the longitudinal axis. The lighting device may further comprise a cap, and wherein the carrier is arranged on said cap. The cap may be adapted to fit in an electrical socket. The arrangement of the carrier in the cap, extending in a plane along the longitudinal axis may provide a lighting device with few parts. The longitudinal axis may extend through the center of the cap. The at least one light source arranged on the carrier may thereby emit light in a main direction which is perpendicular to the longitudinal axis. The lens may however direct light in a plurality of directions, including a direction substantially in parallel with the longitudinal axis. The cover member, who may enclose the carrier, may thereby extend in the same plane as the carrier, and also be arranged in said cap. The cover member, the optical structure, and the cap may provide an entire outer surface of the lighting device, together enclosing the carrier and the at least one light source.

Alternatively, the carrier may extend in a plane perpendicular to said longitudinal axis. The carrier may thereby be arranged with light sources providing a spotlight arrangement. The cover member may be arranged to be in contact with both the front and back side of the carrier in order to provide the same thermal properties as for a lighting device with a carrier in parallel with the longitudinal axis.

In another embodiment, a first section of the cover member encloses the carrier extending in said first plane, and wherein a second section of the cover member extends in a second plane with an angle to said first plane. A further extension of the cover member may improve the heat transfer capability of the cover member due to a larger surface exposed to the surroundings of the lighting device. The second section of the cover member may extend in parallel with the longitudinal axis. The two sections of the cover member may thereby form a cross shaped cross section when seen in direction of the longitudinal axis. Alternatively may the second plane be transverse to the longitudinal axis as well as the first plane. If an outer surface of the cover member is a reflective surface, or is provided with a reflective coating, the second section of the cover member may improve the optical performance of the lighting device. Yet alternatively, for a spotlight arrangement, the second plane may be in parallel with the longitudinal axis, and with an angle to the first plane. The cover member may comprise further additional sections, such as a third and a fourth section. The sections may form various formations. For instance three sections of the cover member may form a triangle shape. Further, the carrier may be a first carrier, and wherein the lighting device further comprises a second carrier enclosed by the second section of the cover member. The second carrier may be arranged to extend in said second plane transversal to the first plane in which the first carrier extends. The second carrier may be provided with at least one solid state light source. The second section of the cover member may be provided with an optical structure corresponding to the light source on the second carrier. By providing the second carrier and the light source thereon, light may be emitted from the lighting device in additional directions. The optical performance of the lighting device may thereby be improved.

In one embodiment, the optical structure may be designed to provide non-symmetric optical properties. The optical structure may be designed to direct the light from the at least on solid state light source in a non-symmetrical manner, providing a non-rotational symmetry of the luminous intensity distribution. That is, a circular or dome shaped lens may provide a non-uniform light output along its light output directions. When the arrangement comprises a plurality of light sources and a plurality of lenses, the lenses may be non-symmetrically designed such that the overall light output from the arrangement is uniform or in an otherwise desired way. The non-symmetric lens may be designed to direct a minimum amount of light towards a neighboring lens. The lens may comprise an inner cavity, which inner cavity surrounds the light source(s) which the lens is arranged in front of. The inner cavity may be shaped in order to provide the non-symmetric luminous intensity distribution of the lens. Due to the shape of the inner cavity, the refraction of the light from the light source(s) reaching the lens may provide a desired luminous intensity distribution. Alternatively, the non-symmetry of the lens may be provided by the design of an outer surface of the lens.

In an alternative embodiment, said carrier may be a first carrier with a first front and back side having at least one solid state light source arranged on the first front side, wherein the lighting device further may comprise a second carrier with a second front and back side and having at least one solid state light source arranged on said second front side, and wherein said second carrier is arranged in parallel with said first carrier. A lighting device comprising two flat light source holding plates in the same cap may provide an arrangement with an improved thermal resistance. I.e. the thermal resistance of the cover member in thermal contact with both carriers may be lowered. The cover member may be in thermal contact with the front sides and back sides of both carriers. The cover member may enclose both the first and the second carriers. Each front side of the carriers may be provided with one or more light sources. The two front sides may be directed in opposite directions. Heat from the light sources on the front sides may be spread also to the respective back side, thereby increasing the thermal performance of the arrangement.

In an alternative embodiment, the carrier may be formed as an integrated part of the cover member. The carrier may be a part of an inner surface of the cover member. The electrical connections of the carrier may be printed directly on said inner surface of the cover member, and the light sources may be arranged on said inner surface.

In one embodiment, the carrier and the cover member may have a curved shape. The carrier may extend in a bent or curved plane which has a radius. The cover member may have a corresponding shape and be in thermal contact with the front and back side of the curved carrier. A flexible board material may be used for forming the carrier. Such formed lighting device may in some embodiments provide improved optical performance of the arrangement.

Further, the carrier may be a first carrier and the lighting device may further comprise a second and a third carrier, wherein the three carriers may be arranged with angles relative each other, and wherein the cover member may be in thermal contact with a front side and a back side of all carriers. An arrangement with the thermal properties and compact arrangement of the present invention may thereby be used in an embodiment with improved optical performance. The three carriers may be arranged, each with a longitudinal edge in contact with corresponding edges of the other carriers. Such longitudinal edge may coincide with a longitudinal axis of the lighting device. The carrier may form a star like shape of the lighting device. The lighting device may also comprise further carriers forming other shapes and providing other optical performance, which may be desired in certain applications.

In another embodiment, the carrier may have a buckled surface forming two carrier sections extending with an angle to each other. In this embodiment, buckled means that the two carrier sections are coupled to each other in such a way that the two carrier sections may be directed slightly differently, forming an angular bent shape of the carrier. Both carrier sections may be provided with light sources which thereby may emit light in different directions. The two carrier sections may be arranged in parallel with a longitudinal axis of the lighting device, but with an angle relative to each other. Alternatively, both sections may be arranged in parallel with an axis perpendicular to the longitudinal axis.

In another embodiment, the carrier is a double-helical shaped surface positioned in parallel to the longitudinal axis. This shape has the advantage that the solid state light sources that are connected to the carrier are now directed in other directions than only perpendicular to the longitudinal axis. Note that the double-helical shaped surface has the property that a normal to this surface is in general not perpendicular to the longitudinal axis of the lighting device. This will lead to a lighting device having a more uniform luminous intensity distribution. Preferably, the double-helical surface has a first end pointing in the direction of the connection member, and a second end pointing away from said connection member, wherein the respective orientations of double-helical surface perpendicular to the longitudinal axis at the first end and at the second end differ by an angle in the range from 15°-360°. A uniform light distribution may be realized when the respective orientations differ by about 90°, even a difference in orientation of about 45° may give an acceptable performance.

For the embodiments that comprise the second solid state light source, the lighting device may comprise electrical connections for independently powering the solid state light source and the second solid state light source. This has the advantage that different light sources, for instance those on the front side and those on the back side, can be addressed independently. This may be for independently switching them on and off, but it may also be for dimming or color changing aspects.

It is noted that the invention relates to all possible combinations of features recited in the claims.

BRIEF DESCRIPTION OF THE DRAWINGS

Various aspects of the invention, including its particular features and advantages, will be readily understood from the following detailed description and the accompanying drawings, in which.

DETAILED DESCRIPTION

Figure 1:
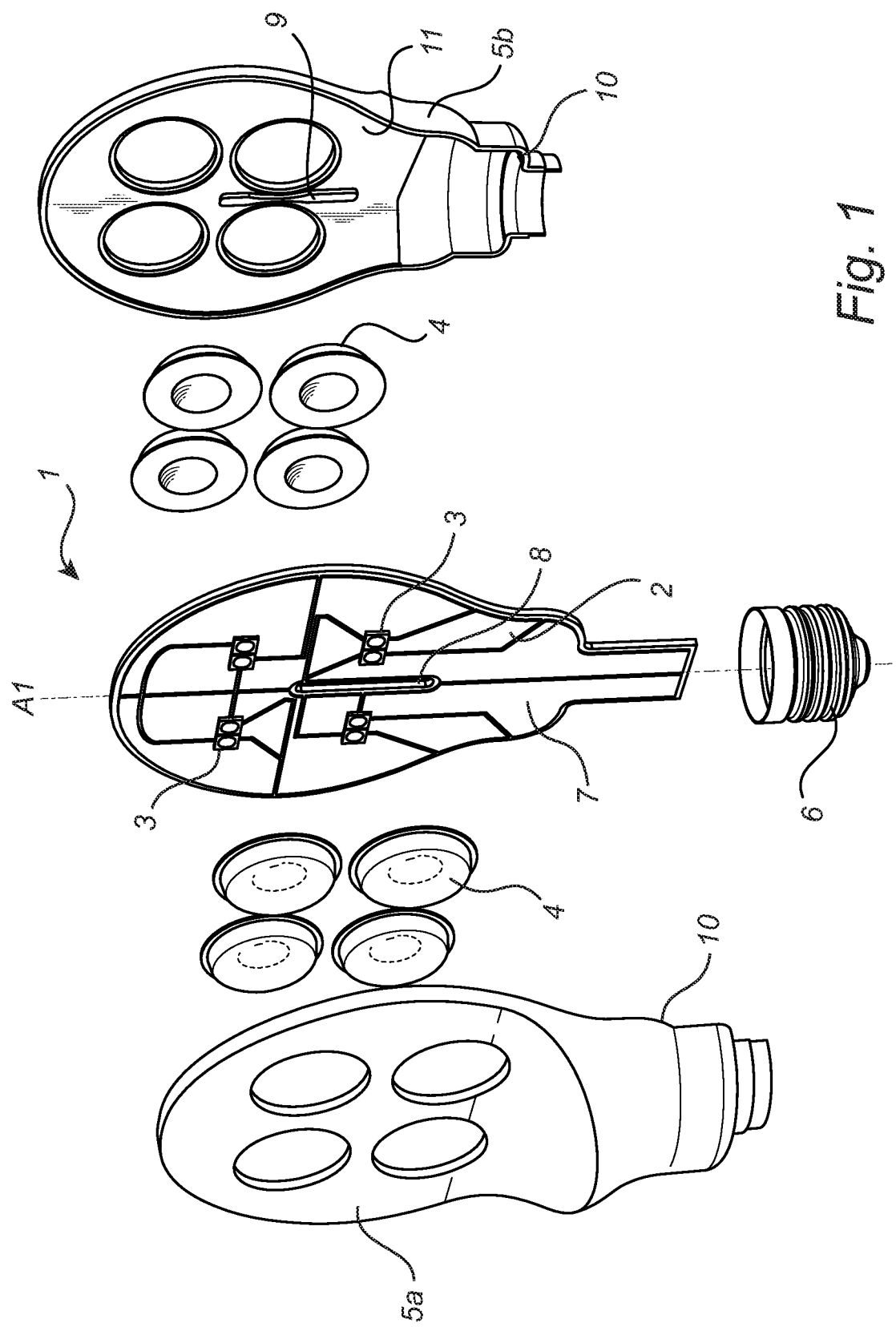
FIG. 1 is an exploded view of a lighting device according to an embodiment of the invention, comprising optical structures in the form of separate lenses.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout.

In FIG. 1, an exploded view of a flat lighting device, such as a flat lamp 1, is shown. The flat lamp 1 is shown in a standing manner defining a longitudinal axis A1. The flat lamp 1 comprises a carrier 2, like for instance a printed circuit board, a plurality of light sources 3, such as LEDs, OLEDs and PLEDs or the like, placed on the carrier 2, a plurality of lenses 4, a first cover member 5a and a second cover member 5b arranged to cover each side of the carrier 2, and a cap 6, adapted to be fitted in an electrical socket. The carrier 2 defines a plane extending along the longitudinal axis A1, and is arranged in the cap 6. The electrical connection from the electrical socket may be directly coupled from the cap 6 to the carrier 2, or it may be wire connections between the cap 6 and the carrier 2. Further, the electrical connection may comprise additional electronic components, for instance for driving the light sources 3. In the illustrated embodiment, the light sources 3 are arranged in separated subgroups, wherein each subgroup comprises two light sources 3. A subgroup may alternatively comprise one light source. The flat lamp 1 is symmetrically arranged, having four subgroups of light sources 3 placed on each side of the carrier 2 in the same pattern. The cover members 5a, 5b are adapted to support the lenses 4. Each lens 4 is arranged in front of a subgroup of light sources 3. The cover member 5a, 5b is adapted to be in thermal connection with the carrier 2 and transfer heat away from the heat source, i.e. the light source 3, via the carrier 2 and further to the ambient air. The cover members 5a, 5b are of a thermally conductive material such as plastic, glass, thermal plastic or ceramic or the like; preferably a material with low thermal resistivity.

The second cover member 5b comprises a protrusion 9 with a corresponding opening or recess 8 on the carrier 2. The recess 8 and the protrusion 9 are arranged to align the carrier 2 and the cover members 5a, 5b correctly at assembly before joining the parts. In order to provide a good heat transfer, the cover members 5a, 5b, are arranged to cover a large part of the area of the carrier 2. The carrier 2 has a front side and a back side. The carrier 2 further comprises a layer of a thermally conductive material 7. This material may be spread evenly across the area of the carrier 2 on each side in order to spread any heat that may arise from the light sources 3. The material that may be used for the thermal conductive layer 7 may be any material with required thermal conductive properties, such as copper. By adding a layer 7 of a thermally conductive material, the heat may be evenly distributed across the carrier 2, therewith reducing the number of zones with excessive heat, and the heat is transported through the cover members 5a, 5b to the ambient.

An inner surface 11 of the respective cover members 5a, 5b is arranged to be in thermal contact with the front side and the back side, and preferably with the thermally conductive layer, of the carrier 2 for good heat transfer.

The heat transfer between the carrier and the cover member may be improved by providing a thermal interface material, TIM, in-between. The TIM may be provided on either or both of the front side and back side of the carrier. In order to increase the heat transfer between the carrier 2 and the cover members 5a, 5b, it is preferred to apply a layer of a thermal interface material (not shown), TIM, between the carrier 2 and the cover members 5a, 5b.

The TIM may be arranged on the front and/or back side of the carrier to be pressed between the cover member and the carrier. The TIM may fill irregularities in the surfaces of the carrier and the cover member, i.e. filling air gaps at the interface between the two. The TIM may be arranged to decrease the amount of trapped air in and prevent the presence of micro bubbles between the carrier 2 and the inside 11 of the cover member. The TIM has a higher thermal conductivity than air, and thereby increases the heat transfer between the carrier and the cover member.

A flat lamp 1 according to the invention may be arranged to suit any size and shape of a retrofit light bulb. The carrier 2 and the cover member 5 may be shaped and sized to suit any requirements. For instance the flat lamp 1 may apply the shape of any standard or decorative light bulb. It may also be possible that the carrier 2 has another shape than being flat.

Each lens 4 is adapted to distribute the light from the light sources 3 in a predetermined manner according to a certain light scheme. The lens 4 may therefore be of a substantially transparent material, although possibly translucent. The lens 4 may also be arranged to transfer heat arising from the light source 3. Depending on a number of choices, such as material, manufacture, luminous intensity distribution requirements, heat properties and such, the lenses 4 may be made from another material, hence separate from the cover member 5a, 5b, or alternatively fully incorporated in the cover member 5a, 5b.

Figure 2:
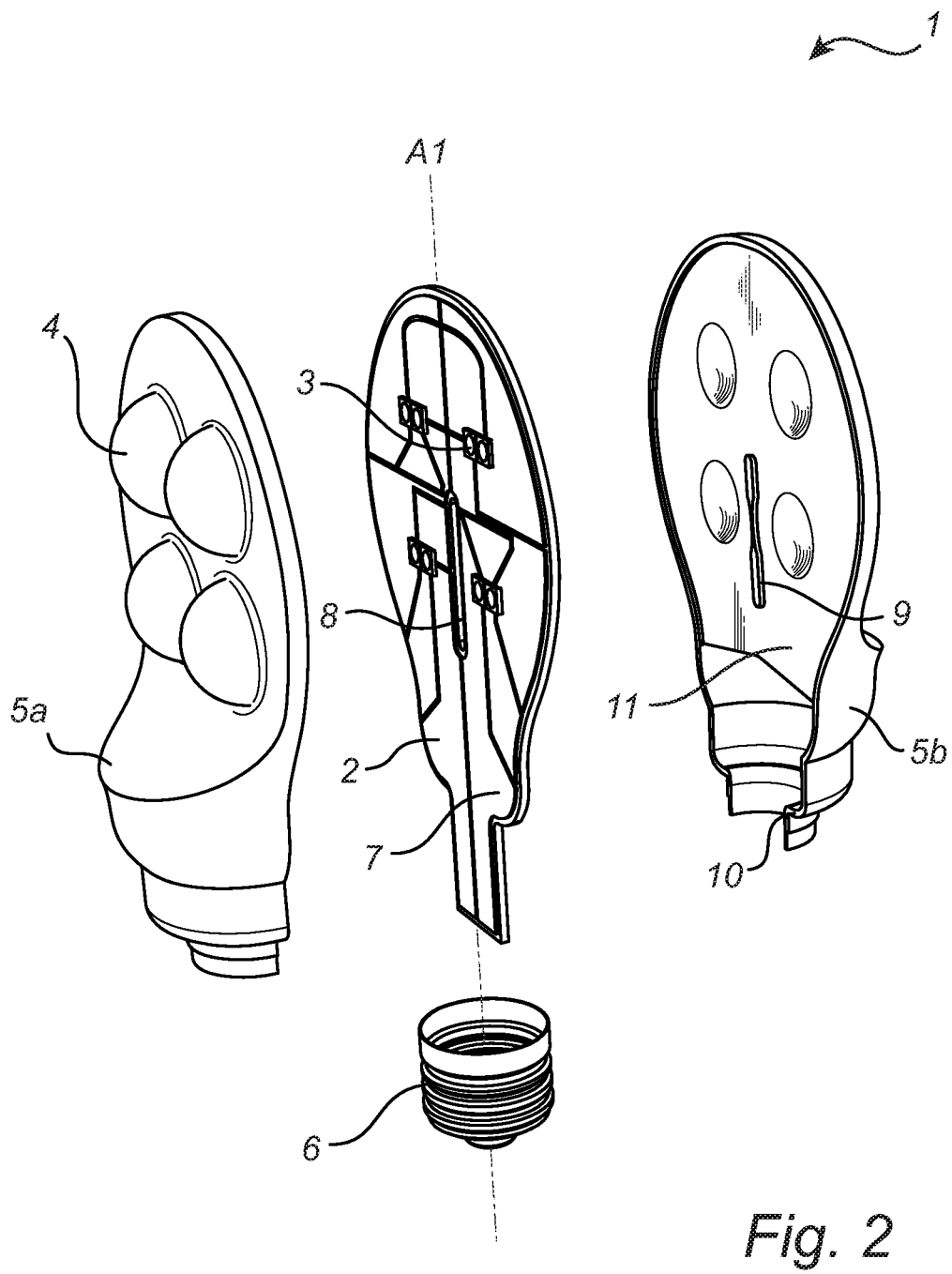
FIG. 2 is an exploded view of a lighting device according to an embodiment of the invention, comprising optical structures in the form of lenses integrated in the cover members.

In FIG. 2, an exploded view of the flat lamp 1 is shown, wherein the lenses 4 are integrated with the cover member 5a, 5b. The cover member 5 may thus constitute the same material as the lens 4, and thereby distribute some of the light emitted from the light source. In order to ensure complete coverage of the carrier 2, the cover member 5a, 5b comprises two parts, a first part 5a and a second part 5b, to be arranged on each side of the carrier 2 and fastened together at a joint 10 along their rims. Depending on manufacturing and assembly capabilities, the cover member 5a, 5b may be arranged with the joint elsewhere, or if possible, cast in one single piece. It is further possible to assemble the two parts 5a, 5b of the cover member by a click arrangement. The joining may alternatively involve gluing or welding of the two parts 5a, 5b together, possibly along the outer rim of the cover member. Alternatively the cover member may be joined by screwing, or any other joining operation that may be suitable and technically available.

The cap 6 in FIG. 1 is provided with a thread to suit an electrical socket. The type of fitting of the cap 6 may however be different depending on the requirements. For instance the fitting may be arranged as a bayonet fitting, a pin fitting (such as of GU10 type) or any other fitting that may be suitable for a flat lamp 1. It may also be of any size suitable for that particular flat lamp 1.

Figure 3:
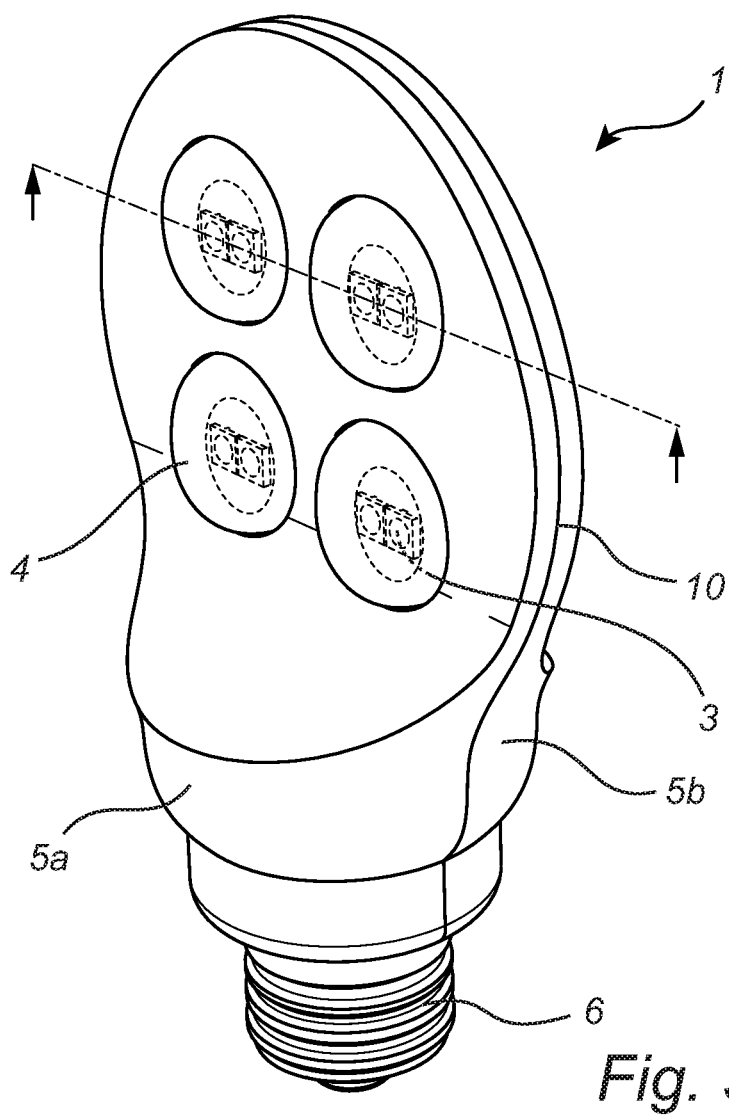
FIG. 3 is a perspective view of a lighting device according to an embodiment of the invention.

FIG. 3 shows a schematic view of a fully assembled flat lamp 1 as the one in FIG. 1. FIG. 3 shows only one side of the carrier 2, having four separate lenses 4, one for each light source 3, that are fitted close to the cover member 5. It is possible that there is provided light sources 3 only on one side of the carrier 2. The cover member 5 may then be appropriately shaped to suit the arrangement. For example the cover member 5 may only be provided with lenses 4 on the side that contains any light sources 3. It is possible that a flat lamp 1 according to the invention comprises light sources 3 on any or both sides of the carrier 2, as well as anywhere on the carrier 2. For instance, if it is required with a more directed light in one direction, a flat lamp may be adapted to spread light from one side of the carrier 2. Also, direction of light may be altered by having different lenses 4. A symmetrically cut lens 4 may spread light virtually uniformly around the light source 3, while a non-symmetrically cut lens 4 may direct the light in a specific required direction. It is also a possibility that several light sources 3 share the lens 4. For example, a larger lens may be arranged to cover more than one light source 4. In the case of only having light sources 3 provided on a front side of the carrier 2, a back side of the carrier 2 may assist to transfer heat from the light sources 3, allowing the heat to transfer through the carrier 2 to a thermally conductive layer on the back side.

Figure 4:
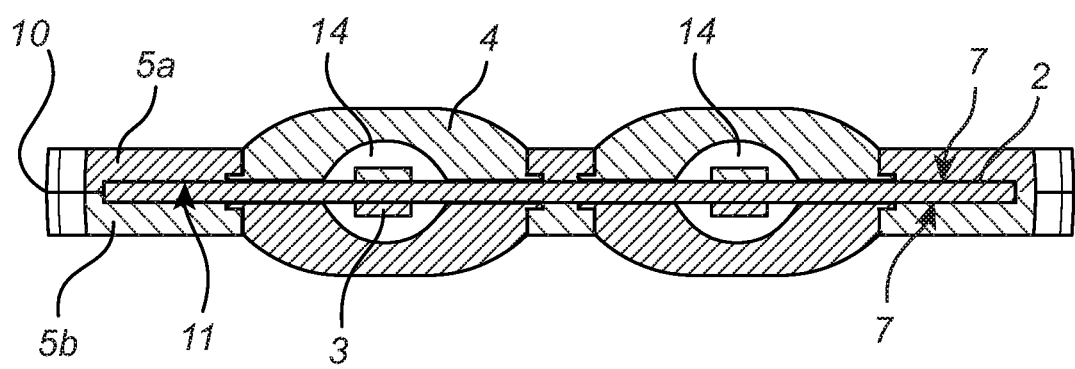
FIG. 4 is a cross-sectional view across the lens of the lighting device of FIG. 3.

FIG. 4 depicts a cross sectional view of a flat lamp 1, taken along a line perpendicularly to the longitudinal axis A1, across the lenses 4 in FIG. 3. The cover member 5a, 5b is arranged closely to the carrier 2, so as to allow thermal contact, for the heat arising from each light source 3 to be transferred via the cover member to the ambient. The lens 4 in FIG. 4 is separate from the cover member, being arranged to be tightly held by the cover member against the carrier 2. The lens 4 in FIG. 4 has a flat surface arranged against the carrier 2 and a domed concave shape arranged above the light source 3. Externally, the lens 4 has a convex shape in order to spread the light evenly to its surroundings. The lens 4 has an inner cavity 14 adjacent the light source 3. The cut of the inner cavity 14 and the external surface of the lens 4 may differ in order to produce a required luminous intensity distribution to its surroundings or, whenever appropriate, add a more focused light in a certain direction.

Figure 5:
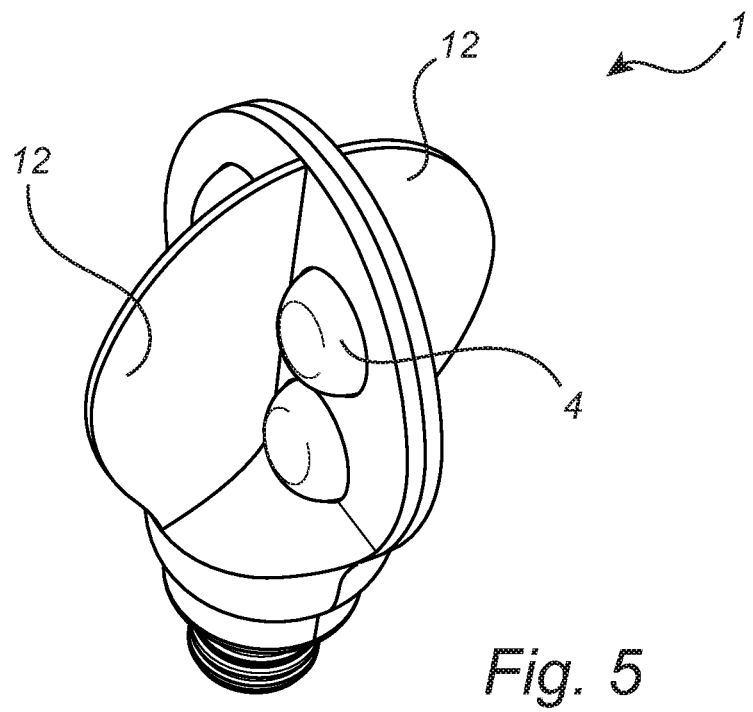
FIG. 5 is a perspective view of a lighting device according to an embodiment of the invention comprising ribs.
Figure 6:
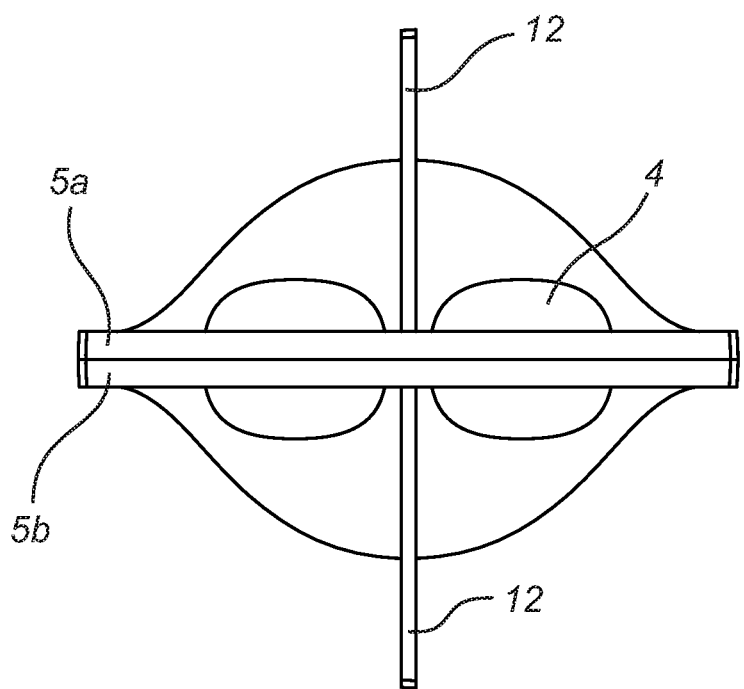
FIG. 6 is a top view of the lighting device of FIG. 5.

In the flat lamp 1 according to the invention, the cover member 5 may be provided with a second section 12 which is arranged with an angle with respect to the first section FIGS. 5 and 6 show a type of flat lamp 1 with a second section 12 of the cover member 5, in the shape of wings arranged perpendicular to the carrier 2. The second section 12 is preferably made from a thermally conductive material, possibly the same material as the cover member or such as a thermally enhanced plastic to improve thermal performance. The second section 12 may be arranged to improve design, strength, thermal and/or optical properties. For instance, the second section 12 may be reflective or refractive for better luminous intensity distribution. The second section 12 may be shaped and arranged anywhere suitable. For instance, the second section 12 may be shaped as ribs, fins or pins, arranged to improve thermal and/or optical performance. The wings, ribs, fins or pins forming the second section 12 can be placed at any angle relative to the cover members 5a and 5b. It is also possible to provide a number of light sources 3 on the second section 12, as shown on the crossed light bulb 30 in FIGS. 7 and 8, e.g. for higher lumen packages. The cover member may further be provided with openings to improve the thermal and optical properties of the arrangement.

Figure 7:
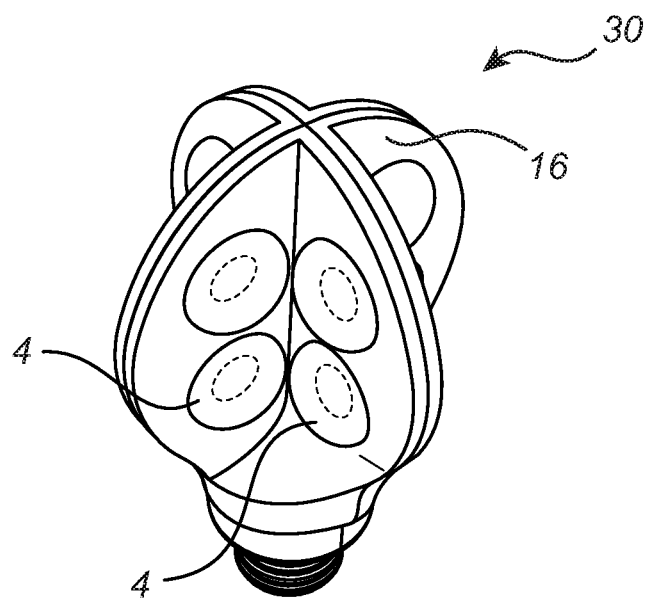
FIG. 7 is a perspective view of a lighting device according to an embodiment of the invention comprising orthogonally arranged carriers.
Figure 8:
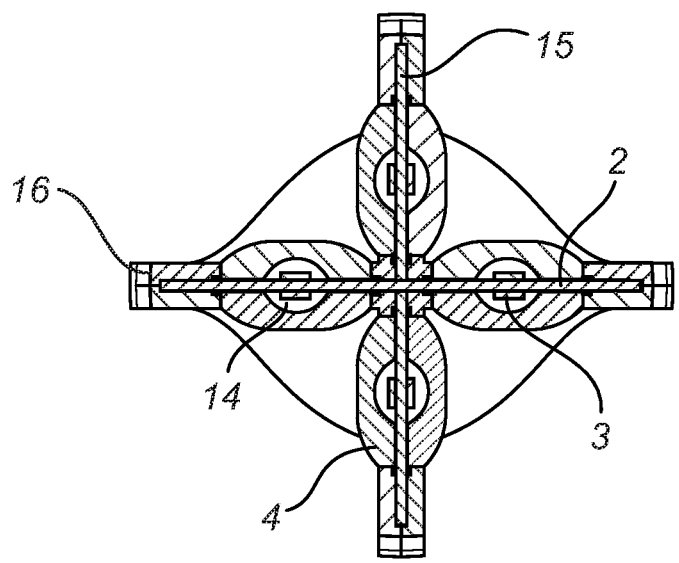
FIG. 8 is a cross sectional view, seen in the direction of the longitudinal axis across the lenses of the lighting device of FIG. 7.

In FIGS. 7 and 8 a crossed lamp 30 is shown comprising multiple carriers 2, 15. On the carriers 2, 15 light sources and electrical connections for powering the light sources are arranged. The carriers 2, 15 are covered by a cover member 16, adapted to suit the crossed design. The light sources 3 may be placed anywhere appropriate as required. The lenses 4 are adapted accordingly regarding shape, size and cut, in order to provide the required luminous intensity distribution. Possibly, the lenses 4 are cut in a non-symmetrical way to direct the light away from the center of the crossed lamp 30. It is possible that the second carrier 15 is angled differently relative to the first carrier 2. For instance, the angle between the first carrier 2 and the second carrier 15 may be larger or smaller than the shown 90 degrees. Further, it is possible that the two carriers 2, 15 do not cross each other, but are arranged in contact with each other under an angle.

Figure 9:
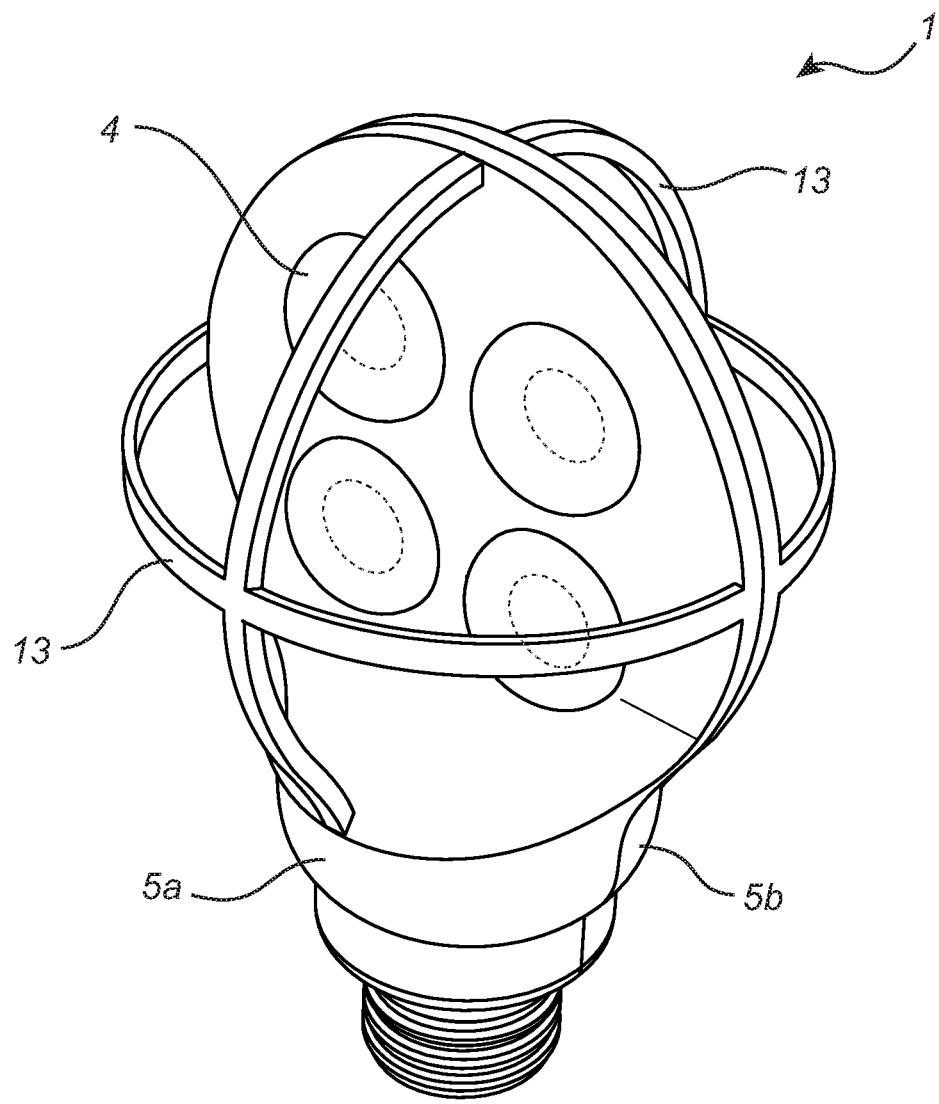
FIG. 9 is a perspective view of a lighting device according to an embodiment of the invention, comprising additional longitudinal and transverse rings.

FIG. 9 shows a lamp as described according to FIG. 1 to which a ring 13 has been added for extra support longitudinally and transversally relative to the longitudinal axis A1, around the flat lamp 1. The ring 13 may provide support to a luminaire. The ring 13 may also be of a thermally conductive material, such as aluminum or the like, or of the same material as the cover members 5a and 5b, to provide improved thermal performance. The ring 13 can be located anywhere around the flat lamp 1.

Figure 10:
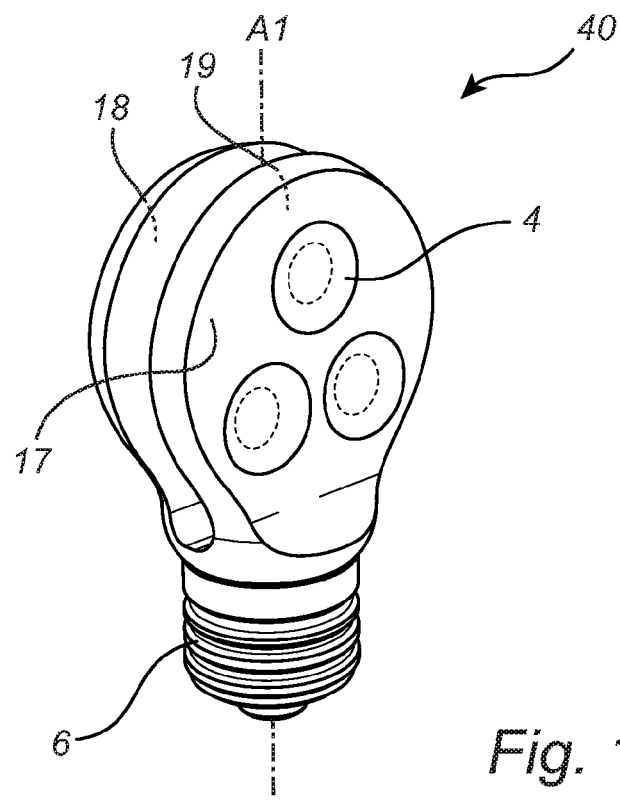
FIG. 10 is a perspective view of a lighting device according to an embodiment of the invention comprising multiple parallel-arranged carriers.

In FIG. 10, there is shown an embodiment of a lamp having a double walled arrangement 40. This arrangement is designed having two carriers 18, 19 arranged in parallel relative to each other. The carriers 18, 19 are provided with a plurality of light sources 3 and lenses. The carriers 18, 19 are covered with a cover member 17, covering each of the carriers 18, 19. The parallel design may be required for instance if additional cooling of the carrier is required, and hence allowing the additional surface area of cover member 17 to transfer the additional heat arising from the light sources 3. The cover member 17 is, due to its complex design, arranged to be suitably assembled. For instance, the cover member 17 may be designed in a plurality of parts to be joined.

Figure 11:
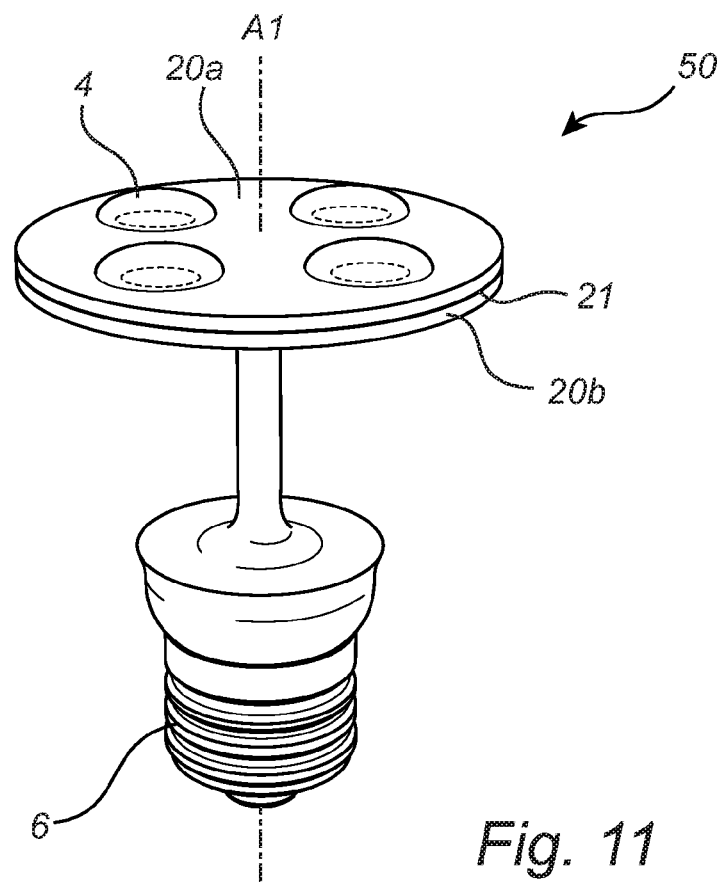
FIG. 11 is a perspective view of a lighting device according to an embodiment of the invention in the arrangement of a flat spot type of lamp.

FIG. 11 shows a flat lamp in the arrangement as a flat spot light 50. The flat spot light 50 comprises a carrier 21 arranged transversally relative to the longitudinal axis A1. The flat spot light 50 comprises a connection between the cap 6 and the carrier 21. This connection may be by an additional carrier arranged from the cap to the carrier 21, or alternatively another type of connection such as wire. The carrier 21 is provided with a plurality of light sources 3 and cover members 20a, 20b. The first cover member 20a in FIG. 11 comprises a plurality of lenses 4, integrated in the cover member 20a. The cover members 20a, 20b may be made from the same type of material. Alternatively, the cover members 20a, 20b are made of different material, including the part of the second cover member 20b extending to the cap 6. It is also possible that the lenses 4 are separate from the first cover member 20a. Light sources and related optical structures may be arranged on one side or on both sides of the carrier 21. The carrier 21 may also be oriented differently relative to the longitudinal axis A1.

Figure 12:
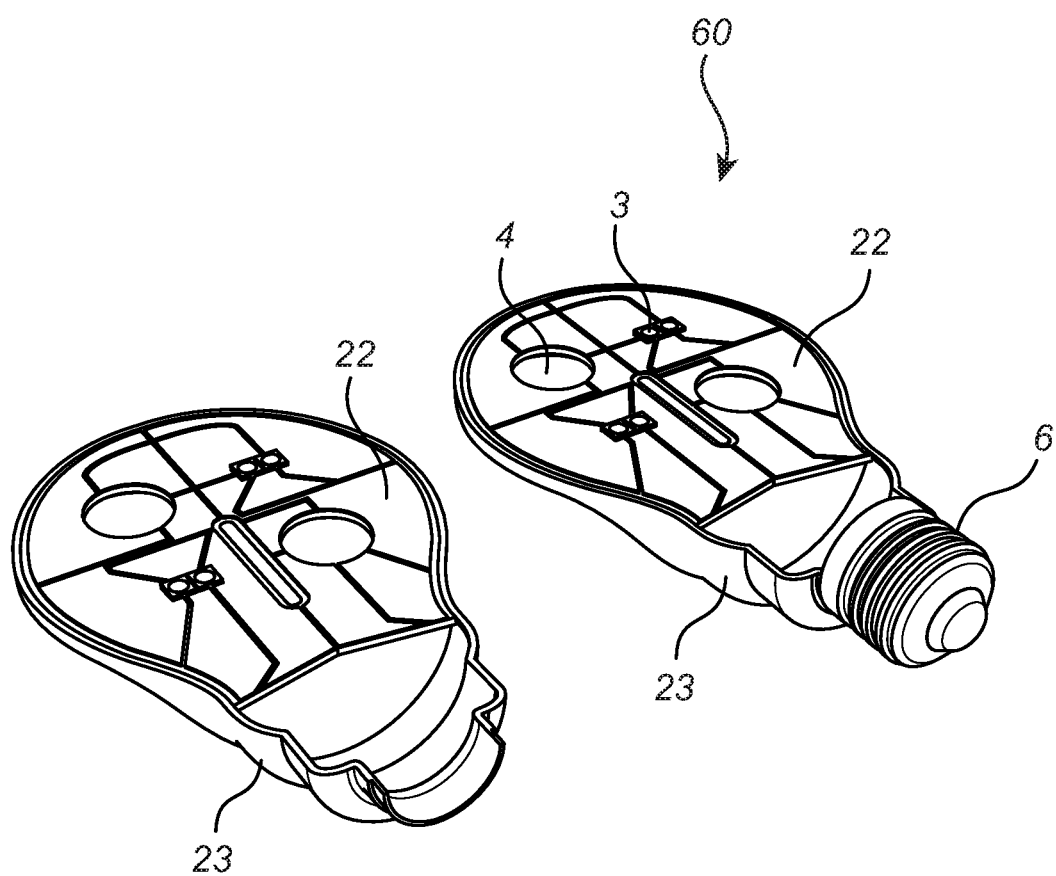
FIG. 12 is a perspective view of a lighting device according to an embodiment of the invention, with the carrier formed as an integrated part with the cover member.

FIG. 12 shows a flat lamp 60 comprising a first cover member 23 with lenses 4, and wherein the carrier is formed as an integrated part of an inner surface 22 of the first cover member 23. The electrical connections are printed on the inner surface 22 of the first cover member 23. Light sources 3 are arranged on the inner surfaces 22 of both parts of the first cover member 23. The second cover member is substantially identical to the first cover member. A lens 4 is arranged on one of the cover members with a corresponding light source 3 on the other cover member. The lenses 4 and light sources 3 are arranged in an alternated manner. A heat spreading layer may be arranged on the inner surface 22 to spread the heat generated by the light sources 3 over the inner surface 22.

In the lighting devices described in connection with the FIG. 5-12 the optical structure for outcoupling the light from the lighting device comprises one or more lenses 4. Alternatively, lightguides or scattering optics can be used as optical structure.

Figure 13:
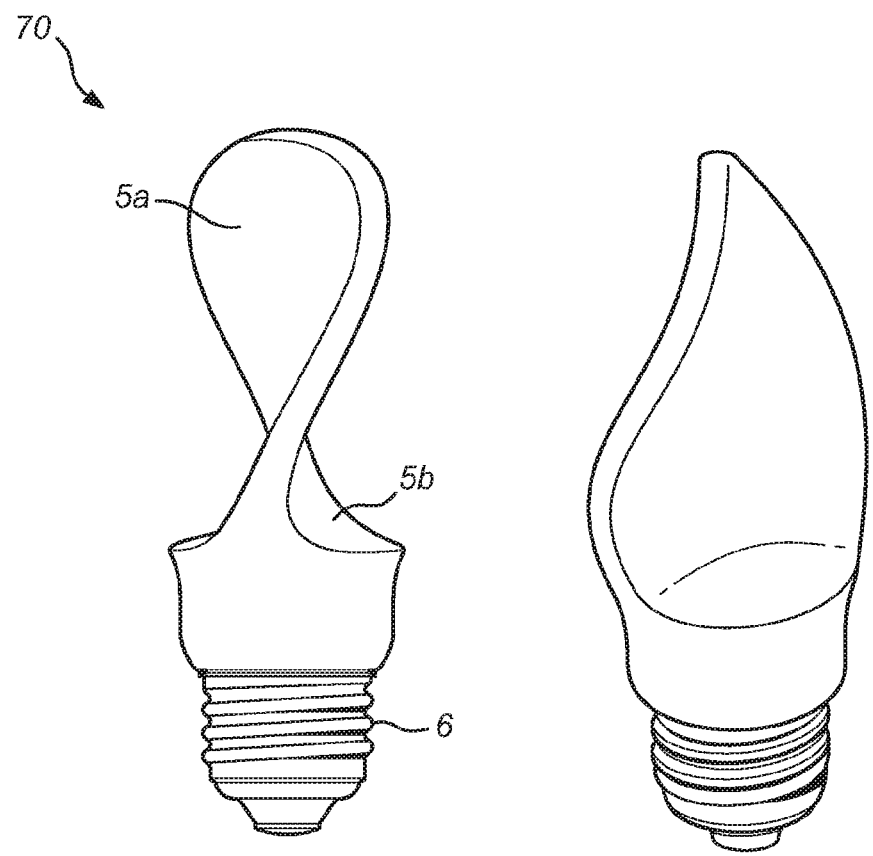
FIG. 13 is a side view of a lighting device according to an embodiment of the invention, comprising a cover member with a double-helical surface.

FIG. 13 shows a flat lamp 70 in which the carrier (not shown) is shaped as a double-helical surface. This surface extends in the direction of the longitudinal axis A1. This carrier can be sandwiched in between the two cover members 5a, 5b. This embodiment is further similar to the construction of the embodiment as shown in e.g. FIG. 1. It may comprise one or more light sources, such as LEDs, mounted on the carrier 2 and a light-transmitting part of the cover members to enable light exiting from the light sources 3.

The double-helical or twisted embodiment has the advantage that the desired luminous intensity distribution will at least partly be determined by the amount of twist between the lower side, near the connection member, and the upper side of the carrier. The effect of the improved luminous intensity distribution is caused by the fact that in a double-helical structure the orientation of the normal of the double-helical surface relative to the longitudinal axis A1 of the lighting device is not constant. The normal of a first portion of the surface is different from the normal of a second portion. Typically, a solid state light source mounted on a carrier, emits light with the central axis of its emission profile pointing in the direction of the normal of the surface at the position the solid state light is mounted. The twisted or curved shape of the carrier enables an improved light distribution around the lighting device.

The effect of the double-helical shaped surface on the luminous intensity distribution is evidently dependent on the amount of twist between the upper side and the lower side of the carrier.

In order to contribute an effective amount to the luminous intensity distribution the twist angle between a first end of the double-helical surface pointing in the direction of the connection member, and a second end pointing away from said connection member, should differ by an angle that is in the range between 15° and 360°. If so desired, the amount of twist may also be larger than 360°.

Good results are obtained when the twist angle is chosen between 60° and 180°, better results with a twist angle of about 90°. Preferably, the twist angle is about 120°. Such a design enables it to obtain a uniform luminous intensity distribution without applying any optical structures in front of the LEDs, by redirecting the light emitted by the light sources arranged on the carrier. It is evident, that a combination of a twisted carrier with optical structures like lenses, light guides or scattering optics is possible as well.

The optical performance of the lighting device 1 can be designed such that a 'light all around' lighting device is possible, despite the apparent flat shape of the lighting device 1. The lighting device can be designed to fulfill the standardized EnergyStar light distribution.

Figure 14:
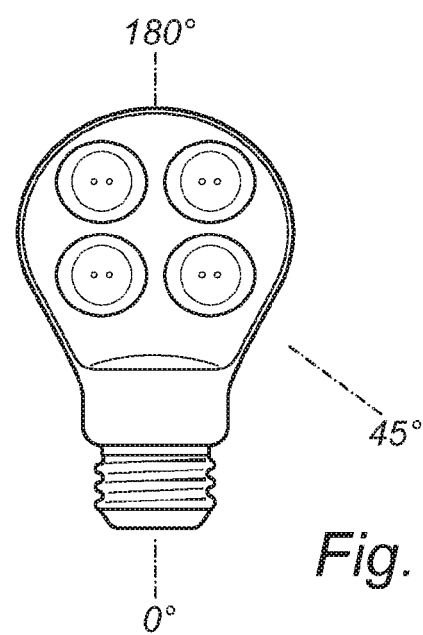
FIG. 14 gives an illustration of the EnergyStar requirement.

For meeting the requirements of the EnergyStar luminous intensity distribution, it is required that that the luminous intensity, in candela, in a zone with angles between 45° and 180° shall not differ more than 20% from the average luminous intensity in that zone. In FIG. 14 this is illustrated for a lamp with a longitudinal axis; the angles are defined as 180° at the top of the light bulb and 0° at the bottom side that is the side were the cap is positioned, making it consistent with the choice of angles in the figures denoting the given luminous intensity distribution of the various embodiments.

The lens design is preferably such that the light emitted from the light sources 3 will not or hardly be obstructed by the neighboring lenses and/or lamp cap 6. This obstruction should be minimized to fulfill the EnergyStar requirements. This typically means that the lens design will be no longer rotational symmetric. In particular, in the direction of the neighboring lens the curvature of the in and/or outside part of the lens shall be different from a direction without a neighboring lens.

Figure 15A:
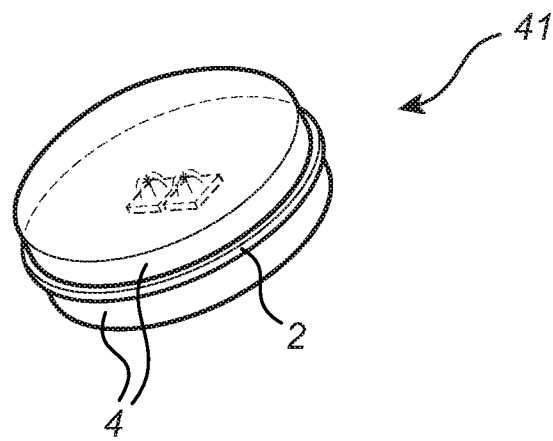
FIGS. 15A, 15B, 15C give a lens element with a near uniform luminous intensity distribution.

In FIG. 15A a lens element 41 is shown comprising two lenses 4 mounted on opposite sides of the carrier. This configuration is according to the characteristics of the lenses 4 in FIG. 4. For this lens element 41 the luminous intensity distribution can be calculated. The luminous intensity distribution is often referred to as far field light distribution, for the lens elements are calculated to give a desired luminous intensity in the farfield.

Figure 15B:
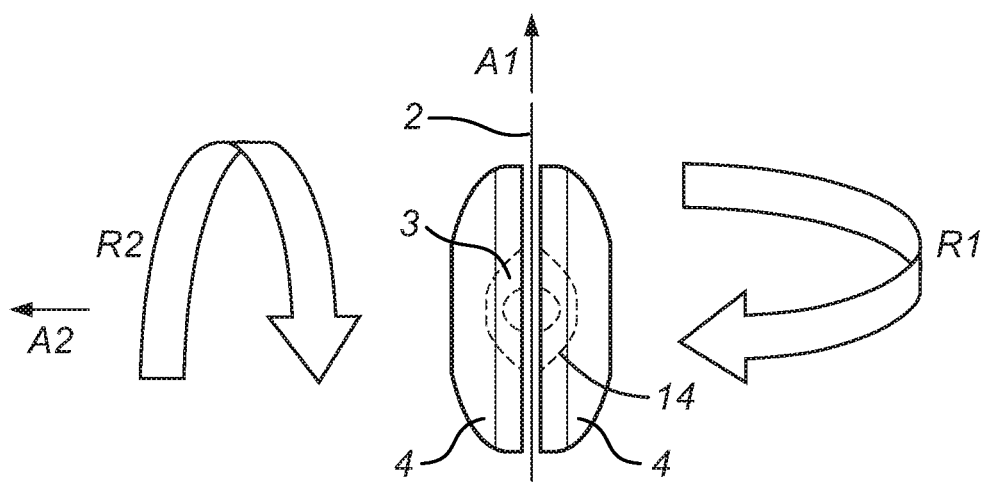
Figure 15C:
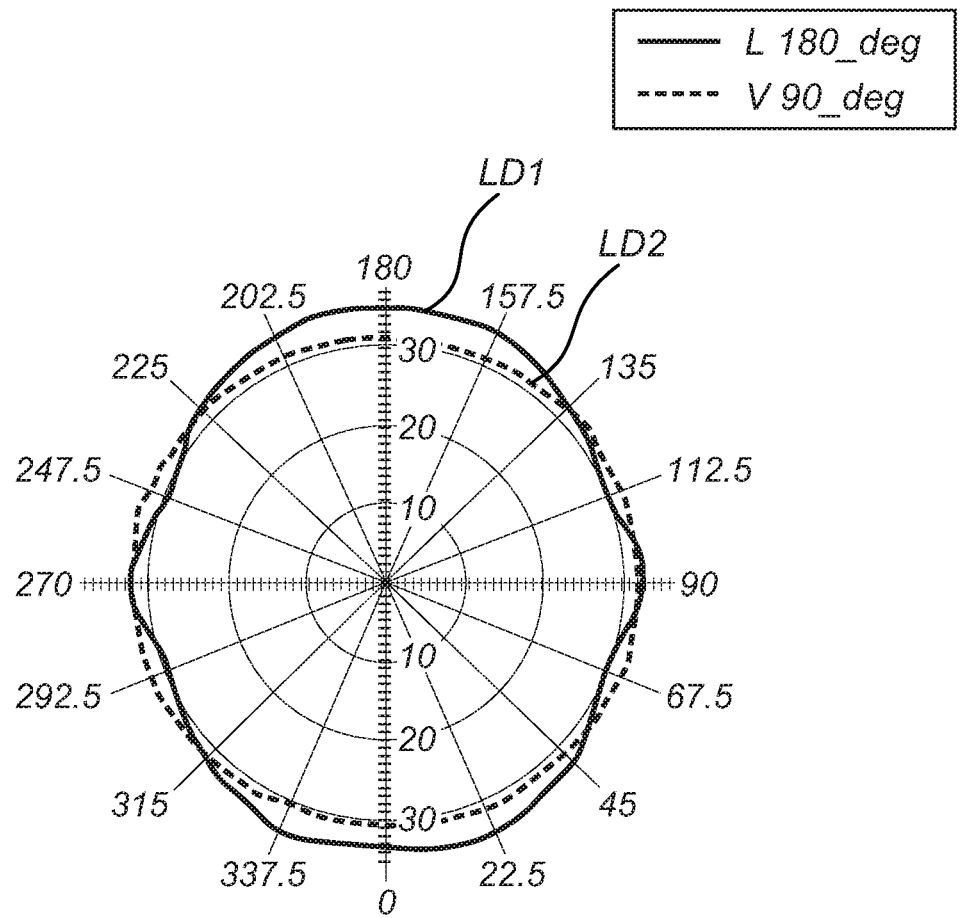

In the example of FIG. 15 the lenses 4 are chosen to be rotational symmetric lenses. FIG. 15B shows a side view on this lens element 41. The arrows indicate the direction for calculating the luminous intensity distributions: R1 should be understood as the rotation around the axis A1, defined in the same direction as in FIG. 1; R2 is the rotation in the plane of the carrier 2, which is around an axis A2 perpendicular to the carrier 2. In FIG. 15C the luminous intensity distributions are shown in the far field for both directions, which is the light distribution when looking from a distance along the axis A1 is calculated to be LD1, and the luminous intensity distribution when looking from a distance along axis A2 is calculated to be LD2. The simulation results in FIG. 15C show a near uniform luminous intensity distribution around the lighting device 1.

The design of the lenses 4 could also be asymmetric lenses, this means that the luminous intensity distribution from one lens element 41 will be no longer rotational symmetric.

Figure 16A:
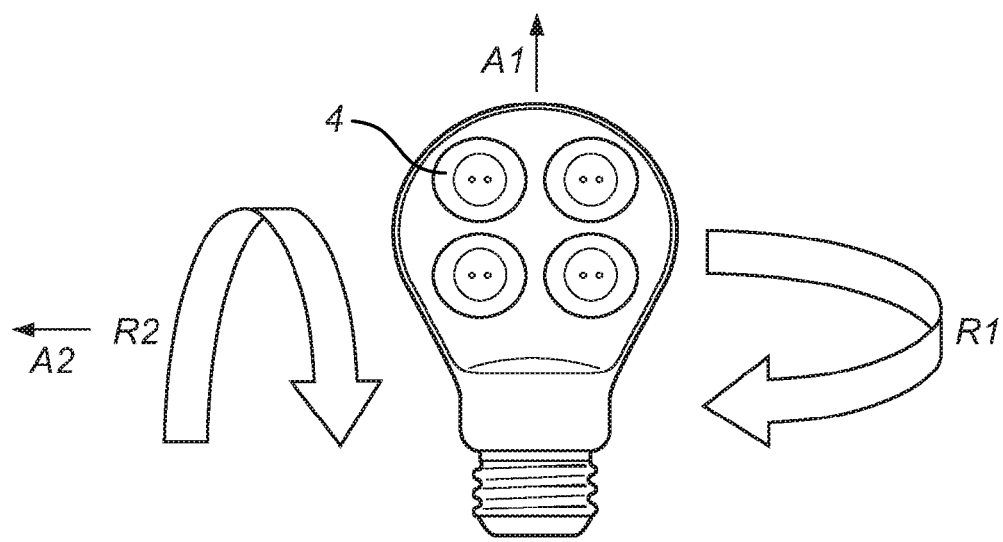
FIGS. 16A and 16B give a lighting device according to an embodiment of the invention and the light distribution of this lighting device.
Figure 16B:
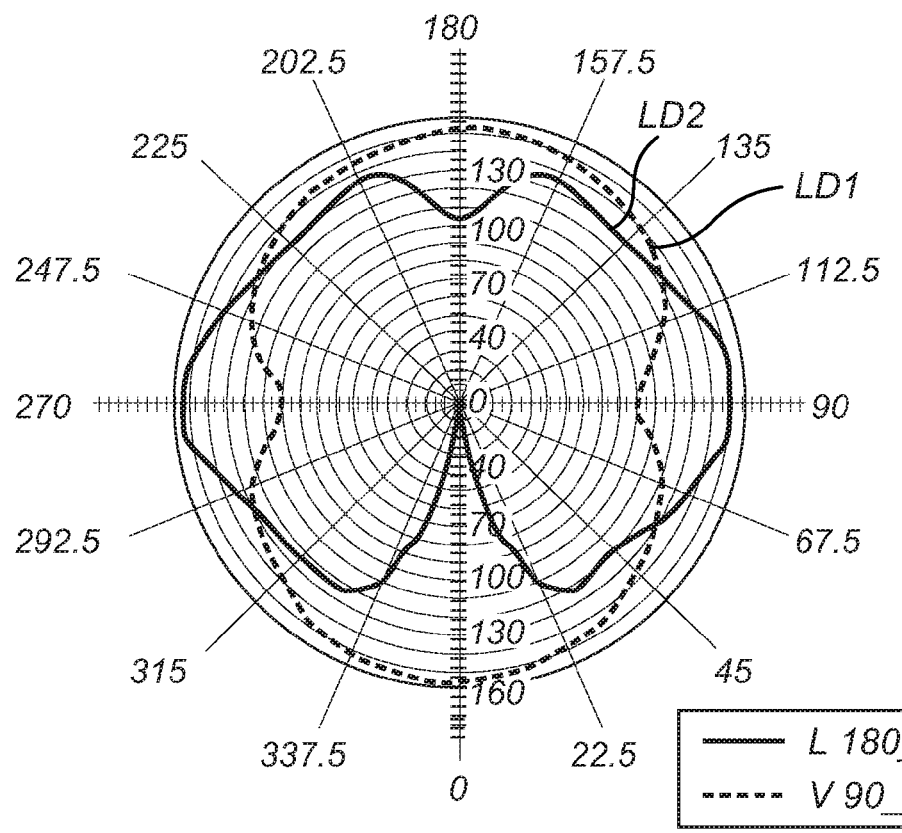

FIG. 16A shows the lighting device 1 according to FIG. 1 provided with rotational symmetric lenses 4. When in total 8 lenses 4 with the lens design as shown in FIG. 15 are placed in the lamp the total luminous intensity distribution can be calculated. The calculated luminous intensity distribution is shown in FIG. 16B: LD1 for a rotation R1 around axis A1 and LD2 for a rotation R2 around axis A2.

As can be seen the luminous intensity is in some directions lower due to shadowing of lenses 4 by other lenses and of the thick part of the flat lamp at the lamp base, however the emitted light produces a light distribution which is close to the distribution necessary for getting an EnergyStar stamp.

In some cases an asymmetric design of the individual lenses 4 could be favorable to enhance efficiency and for example to make a flat lamp that has in the direction of rotation R1 a smooth distribution, which gives a pleasant luminous intensity distribution.

This distribution can be chosen such that the lens thickness will be as small as possible, which is favorable for thermal performance of the lamp and easiness of manufacturability.

Figure 17A:
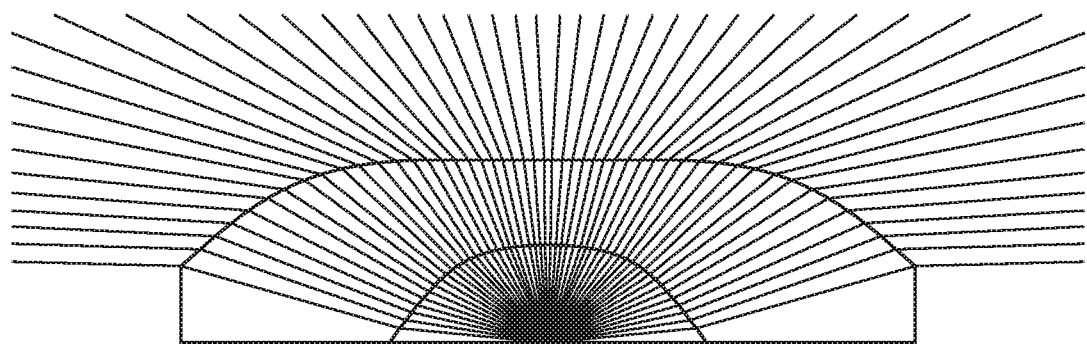
FIGS. 17A and 17B give a lens with a symmetrical and with an asymmetrical light distribution.
Figure 17B:
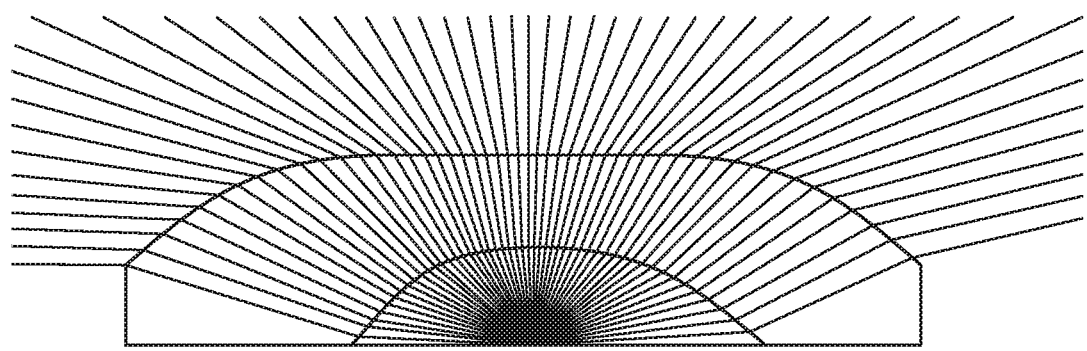

By way of example, two different cross sections of the lens 4 are shown in FIG. 17A/B: a rotational symmetric lens (FIG. 17A) and an asymmetric lens (FIG. 17B). In this design the asymmetry is made by altering the inside part of the lens optic. Evidently, the asymmetrical shape can also be realized by altering the outside contour of the lens 4, by altering the thickness, or by a combination of both outside and inner shape.

An asymmetrical design of the lenses 4, leading to a lighting device 1 with an EnergyStar compliant luminous intensity distribution is now described, referring to FIG. 17C-G.

Figure 17C:
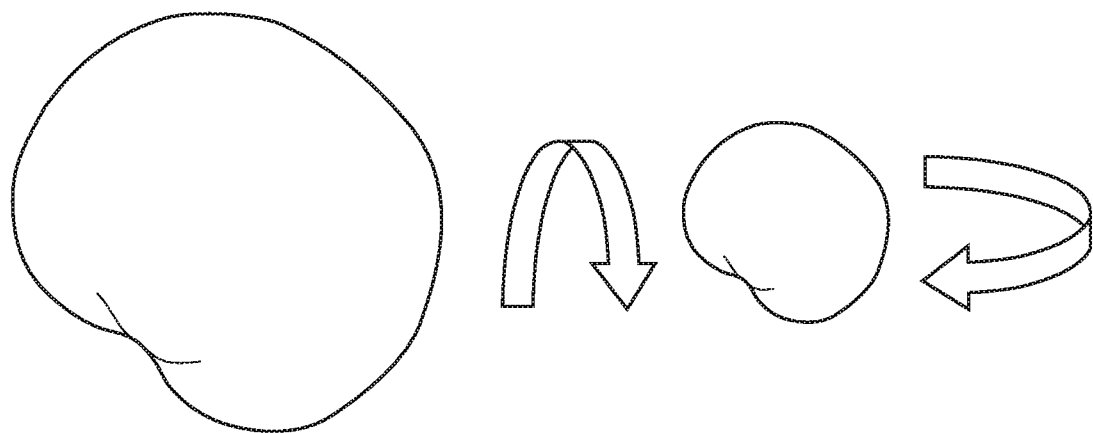
FIGS. 17C-E give an asymmetrical lens design for use in a lighting device according to the invention.
Figure 17D:
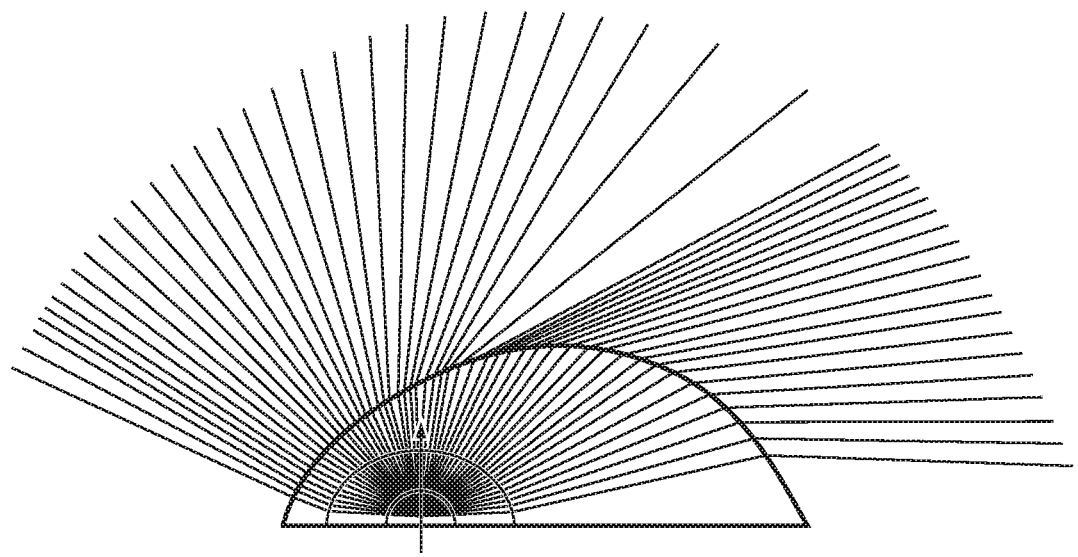
Figure 17E:
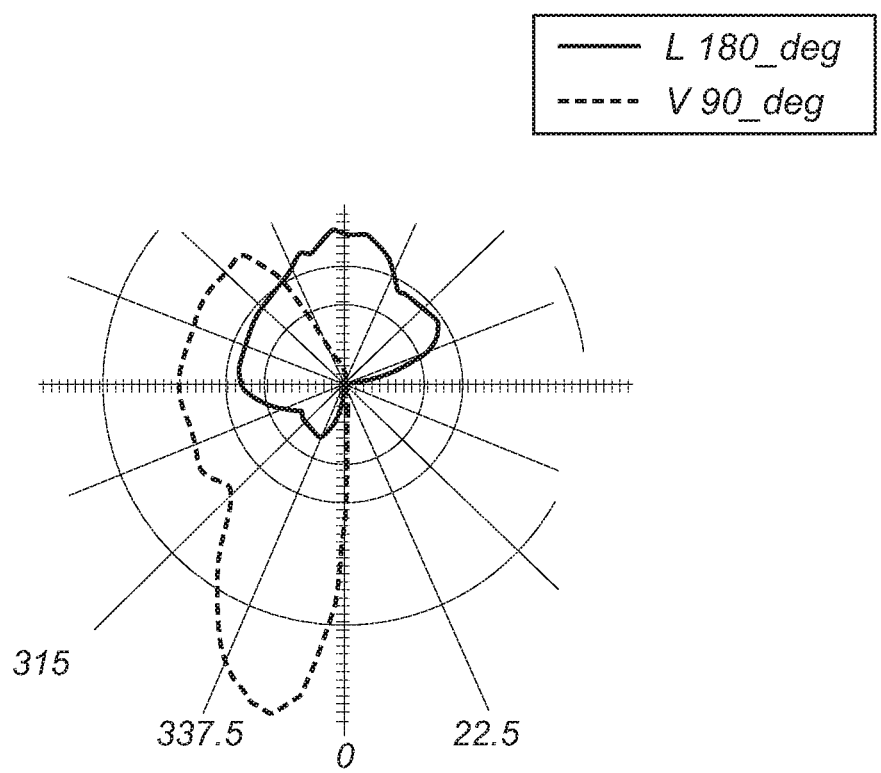
Figure 17F:
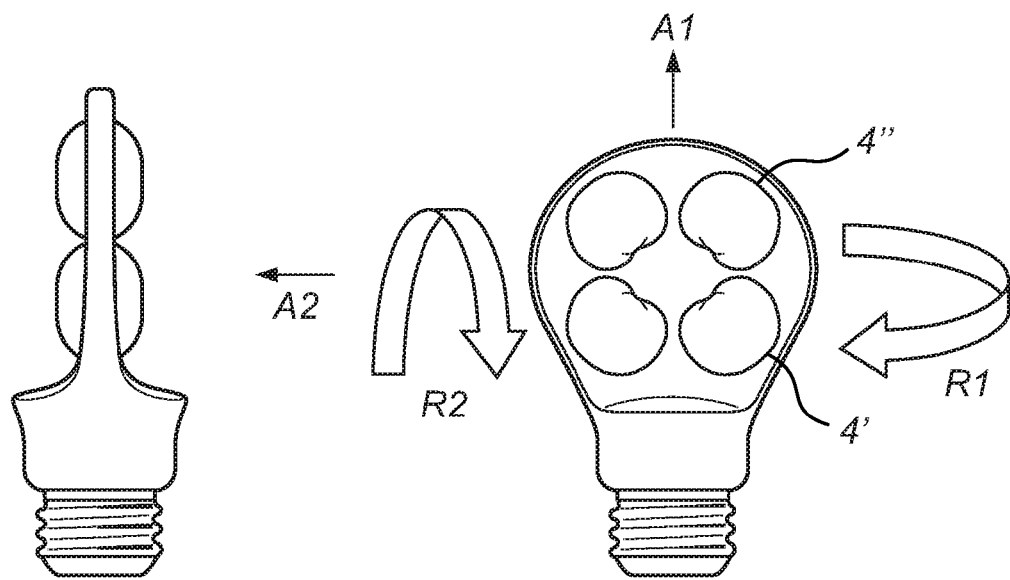
FIG. 17F/G give an embodiment of a lighting device according to the invention with an asymmetrical lens design and an EnergyStar compliant luminous intensity distribution.

In FIG. 17C an asymmetric lens 4 is shown from which the luminous intensity distribution is made such that no shadowing of the lenses occurs when 4 identical lenses are put closely together as shown in FIG. 17F. For getting a lighting device with a homogeneous luminous intensity distribution, this means that the luminous intensity distribution from neighboring (rotated) lenses should compensate the asymmetric luminous intensity distribution of the individual lenses. In FIG. 17D a ray fan through a cross section of the lens is given to show the asymmetry and in FIG. 17E the luminous intensity distribution is shown of only one lens. In FIG. 17F a total lamp with 8 lenses is shown, where it can be seen that the lenses are 90° rotated with respect to each other. It is also possible to design asymmetric lenses with other angles of symmetry.

Figure 17G:
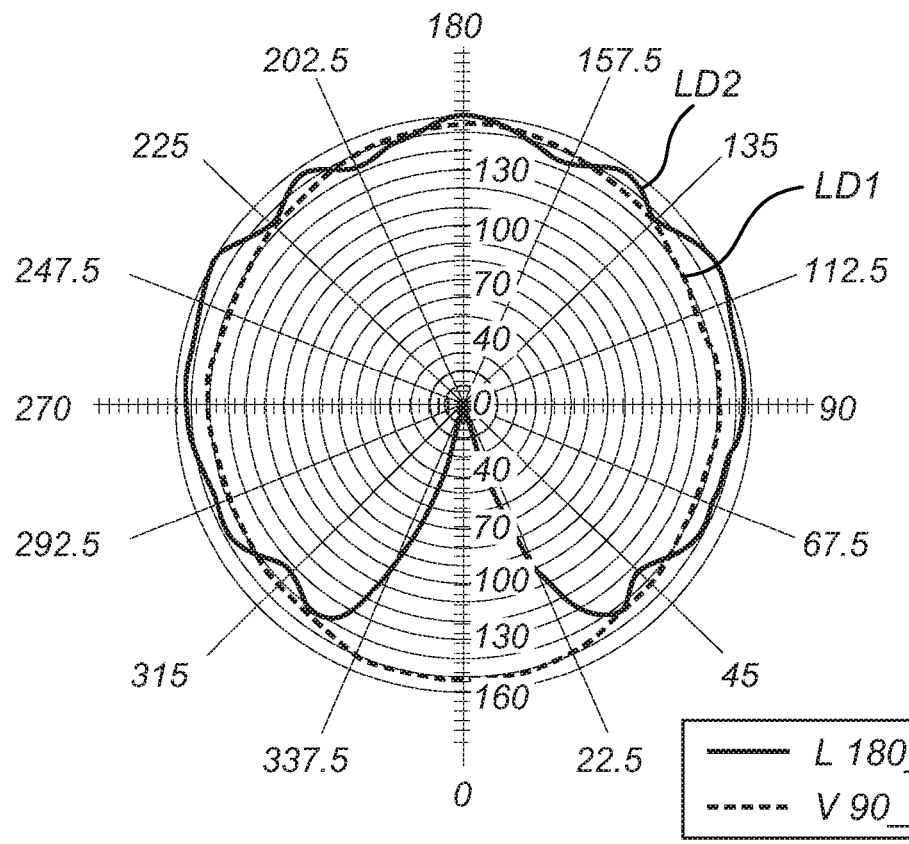

In FIG. 17G the luminous intensity distributions LD1 and LD2 are given for a rotation R1 around axis A1 and for a rotation R2 around axis A2, respectively; adhering to the definitions used in relation to FIG. 15A. The dip in the intensity of LD2 around 0° is caused by the lamp cap 6. The luminous intensity distributions for this design as given in FIG. 17G define a lighting device which fulfills the EnergyStar requirements.

In this design all the individual lenses 4 are the same; this should not be considered as limiting. It is just as well possible to design a uniform luminous intensity distribution using different lenses, for instance the lenses 4' at the side pointing to the cap 6 may be different from the lenses 4" at the top side (pointing away from the cap) of the lighting device 1.

The optical structure of the lighting device 1 that is adapted to direct the light out of said lighting device is not limited to lenses as described here above. Other optical structures can be used for reaching the same objectives, like for instance designing a flat lamp with a uniform or EnergyStar compliant luminous intensity distribution. Other examples of optical structures are lightguides or scattering optics.

Figure 18A:
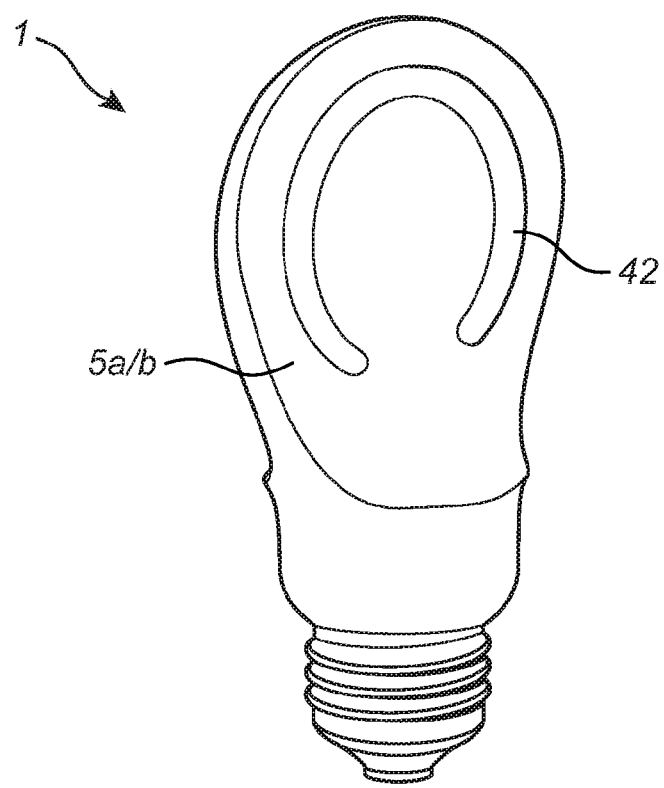
FIG. 18A gives an embodiment of a lighting device according to the invention with a lightguide.
Figure 18B:
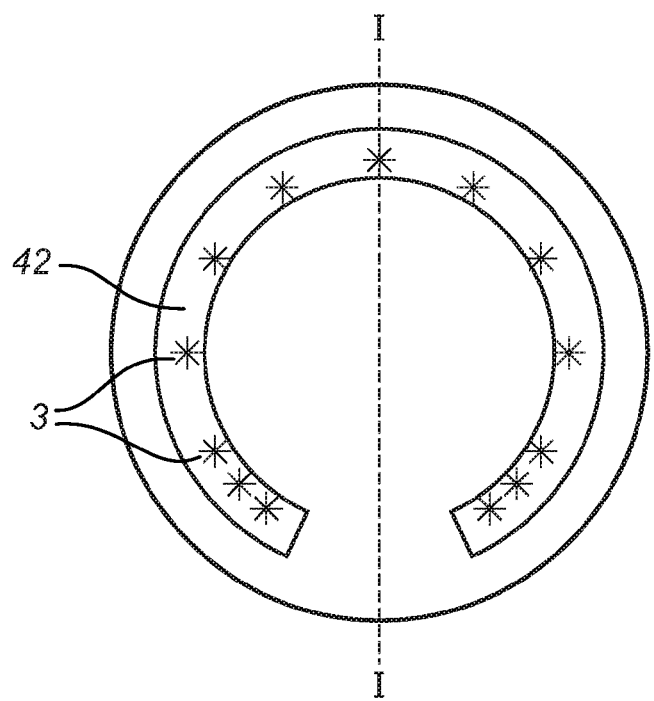
FIG. 18B gives a lightguide for use in the lighting device of FIG. 18A.
Figure 18C:
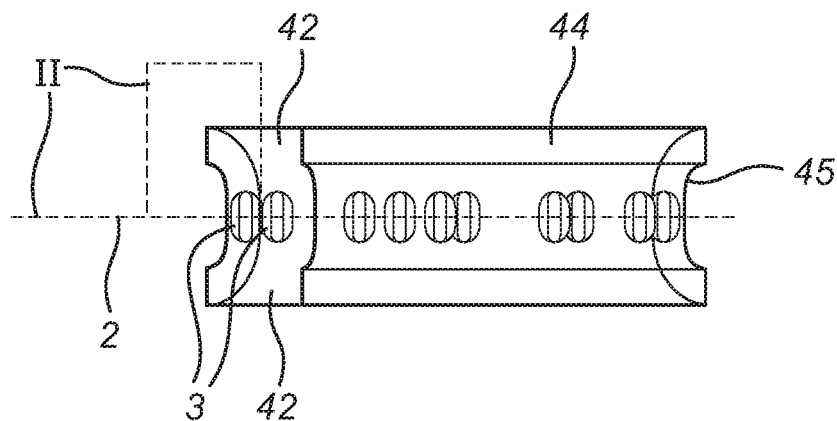
FIGS. 18C-E give the design of the lightguide and the luminous intensity distribution.
Figure 18D:
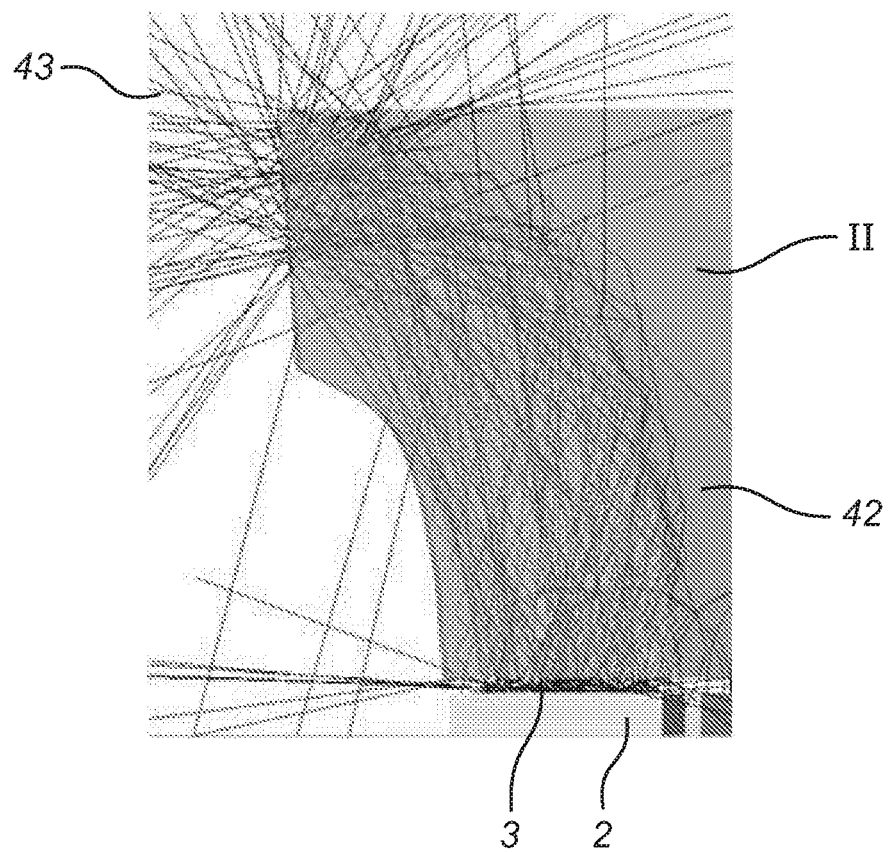
Figure 18E:
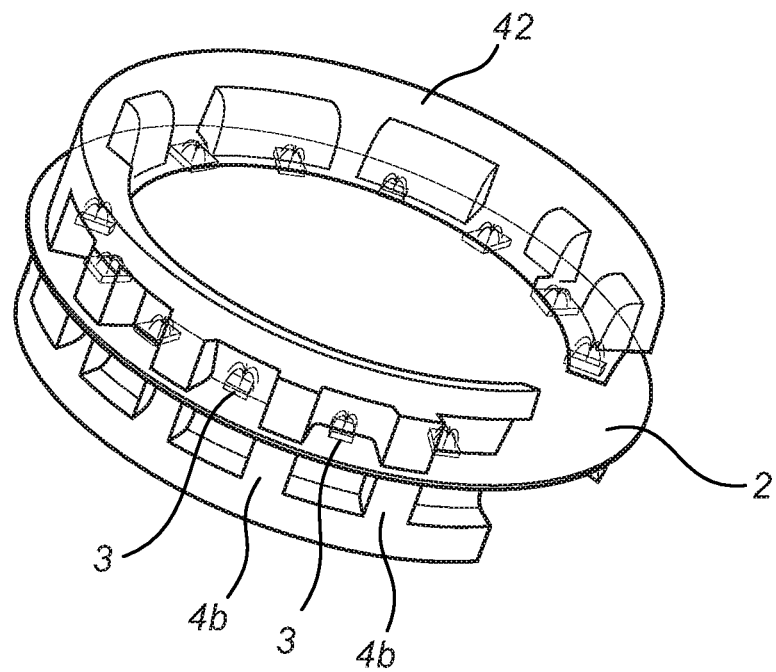

In FIGS. 18A-G a lighting device 1 is given in which the optical structure is a lightguide 42. FIG. 18A shows a perspective view of the lighting device 1 and FIG. 18B gives a front view of the lightguide portion of said lighting device 1. In this example, the lightguide 42 is chosen to have a circular appearance following the outer contour of the cover 5, at least for the top part. At the lower part, near the lamp cap 6 the lighting device of this embodiment has the A-shape contour of the well-known incandescent bulb-type lamps. FIG. 18C gives a cross-sectional view of the lightguide 42 over the line I-I as indicated in FIG. 18B. An enlargement of the section II is given in FIG. 18D, while FIG. 18E is a perspective view of the two lightguides 42 positioned on both sides of the carrier 2. FIG. 18C shows the two lightguides 42 positioned on both sides of the carrier 2 which separates the lightguides 42. In FIG. 18D a portion of the lightguide 42 is shown to indicate the light beam pattern 43 that exits the lightguide 42.

The light is generated by the individual solid state light sources (LEDs) 3 that are positioned on the carrier 2. The light enters the lightguide 42 at the interface between the carrier 2 and the lightguide 42; it exits the lightguide 42 mainly at the top and left side (orientation according to FIG. 18D). The direction of the light exiting from this lightguide 42 determines the luminous intensity distribution. This luminous intensity distribution is made by choosing the right shape of the lightguide, like the curvature 44 determining the inner contour of the circular-shaped lightguide 42 and the shape of the stoop 45 determining the outer contour of the lightguide 42 to make a balance between light leakage and light guiding. The end 46 of the lightguide 42 could have a curvature to tune the luminous intensity distribution.

The lighting device 1 using a lightguide 42 as optical outcoupling structure can be designed to make a luminous intensity distribution for an all-around lamp. It is possible to tune the lightguide such that a uniform or EnergyStar compliant luminous intensity distribution is obtained.

Figure 18F:
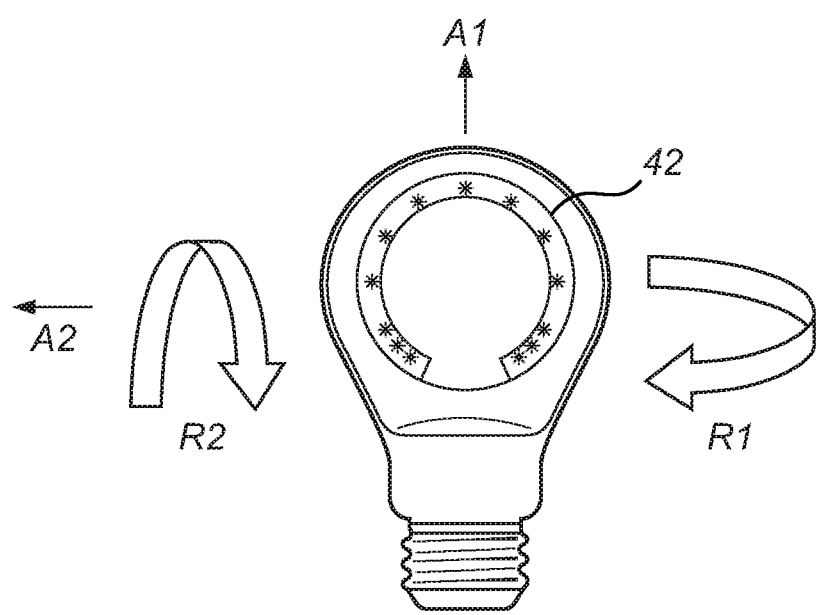
FIG. 18F/G give an embodiment of a lighting device according to the invention with a lightguide and an EnergyStar compliant luminous intensity distribution.
Figure 18G:
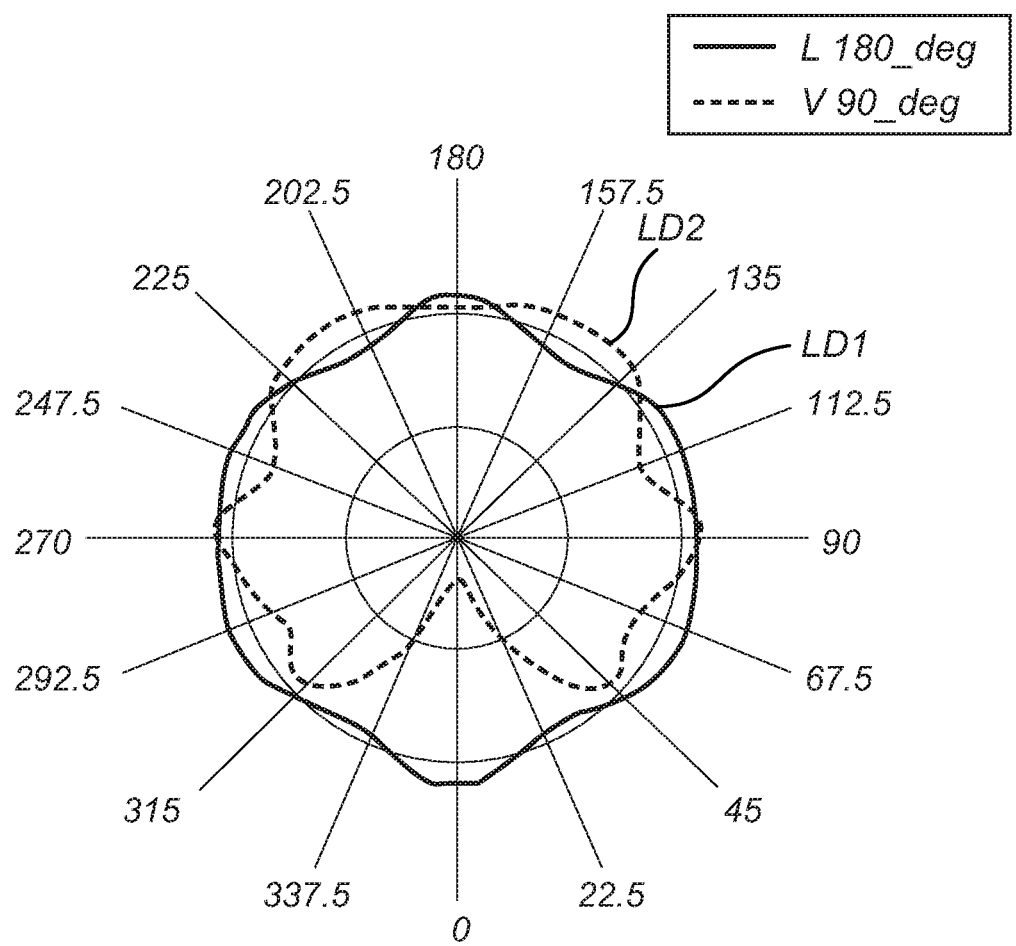

For a circular shaped lightguide 42 as given by FIG. 18B, with a uniform cross-section around the contour, the luminous intensity distribution is given by FIG. 18G which is according to the EnergyStar requirements. FIG. 18F shows a front view of this lightguide element. The arrows indicate the direction for calculating the luminous intensity distribution as shown in FIG. 18G. The EnergyStar compliant luminous intensity distribution is in this embodiment realized by determining the distance between the light sources 3 on the carrier 2. In FIGS. 18B and 18F it can be clearly seen that the distance between two adjacent light sources 3 is larger in the central area of the lightguide 42 than at the edges.

Alternatively, a uniform luminous intensity distribution according to EnergyStar can be accomplished by for instance placing the light sources 3 under a determined angle with respect to the carrier 2.

The lightguide 42 may further be provided with some small prism structures on the outer contour 45 to give the lightguides 42 a more homogeneous illuminated look.

Further, also the contour of the lightguide with respect to the outer contour of the lighting device can be used for obtaining the desired luminous intensity distribution. The shape of the lightguide 42 is not limited to the (not full) circular shape of this example. Other shapes that may be considered are for example, a full circle, a circle positioned on the outer rim of the cover 5 of the lighting device 1, and all types of lightguides 42 that does not follow the outer contour, or that follow the outer contour over the entire rim e.g. the lightguide could follow A-shape till the base cap 6, of the cover 5 of the lighting device 1.

An additional advantage in using a lightguide 42 with respect to the individual lenses 4 is that possible near field multiple shadows and black lines that could appear due to the shadowing of neighboring lenses are avoided.

The material of the lightguide should be preferably be made of a very transparent material, examples of which are PMMA, PC or glass.

For thermal reasons the mechanical fixation is preferable such that the lightguide 42 makes as much as possible contact with the carrier 2. One possibility to achieve this is shown in FIG. 18E where some ribs 46 are positioned on the lightguide 42 between the solid state light sources 3 such that these ribs 46 will hardly affect the optical performance. These ribs are placed on positions where hardly any light hits the lightguide 42.

Figure 19A:
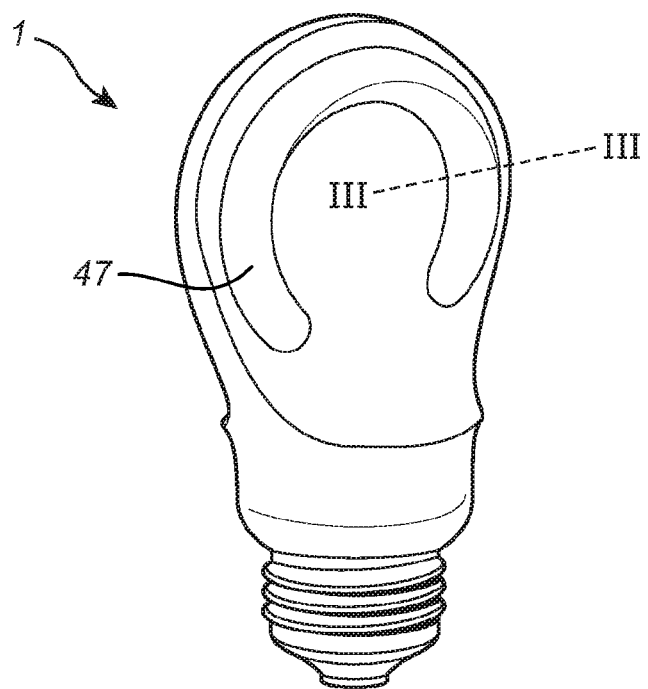
FIG. 19A/B give an embodiment of a lighting device according to the invention with a scattering optics.

The FIG. 19A/B give the outline of a lighting device 1 provided with an optical structure implemented in the form of a scattering optics 47. The scattering optics 47 in this example is ring-shaped/circular-shaped, protruding from the plane of the carrier 2. The use of scattering optics is very well suited for determining the desired luminous intensity distribution. In the example of FIG. 19A/B, the light-transmitting part of the cover member can be an integrated part of the cover 5. Alternatively, the scattering optics may be a separate part that is enclosed by the cover member 5a/b.

Figure 19B:
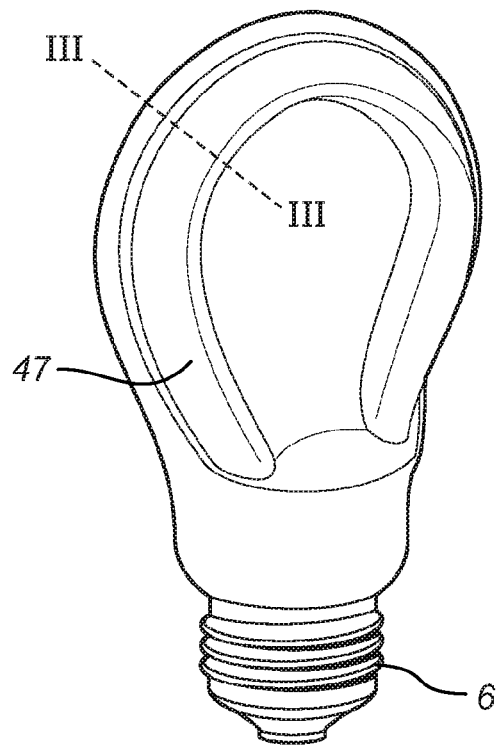
FIG. 19C gives a cross sectional view of the scattering optics of the embodiment of FIG. 19A/B.
Figure 19C:
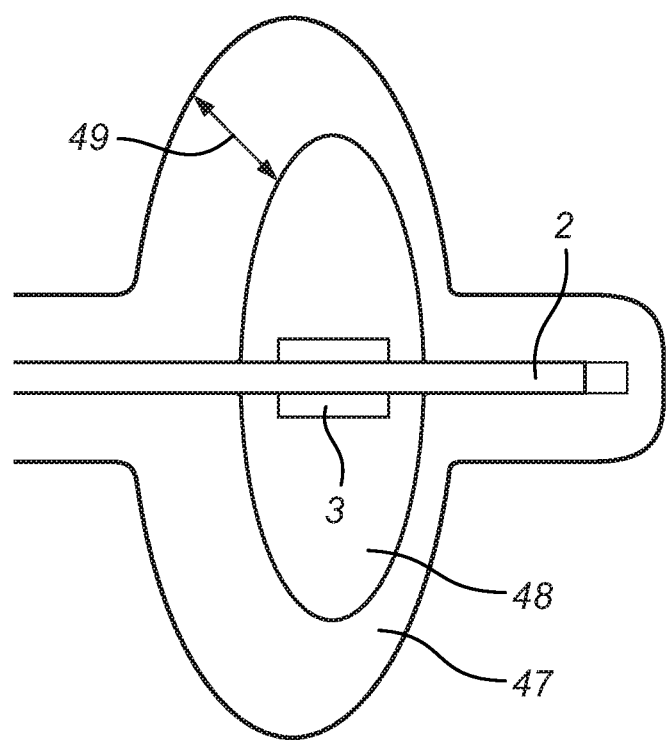
Figure 20A:
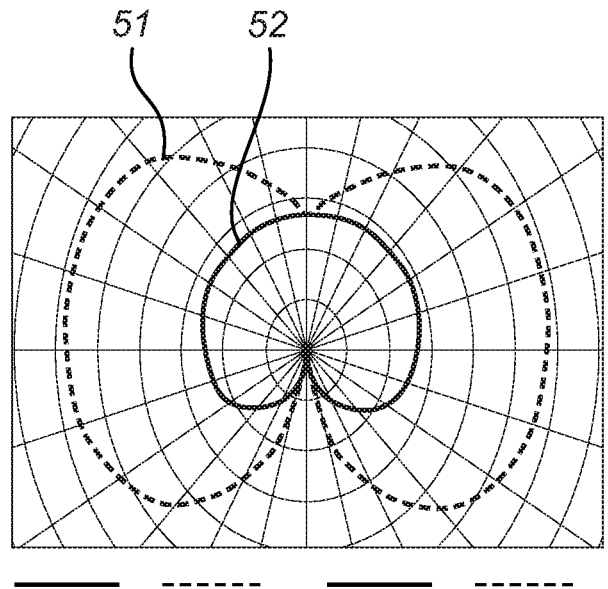
FIGS. 20A-E give different designs of the scattering optics.
Figure 20B:
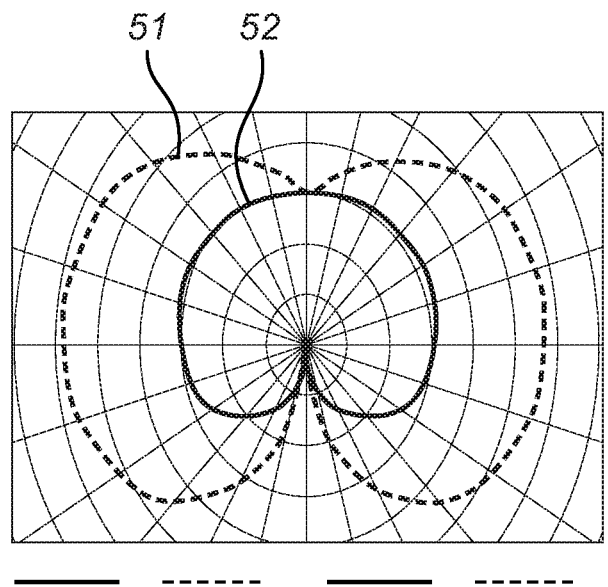
Figure 20C:
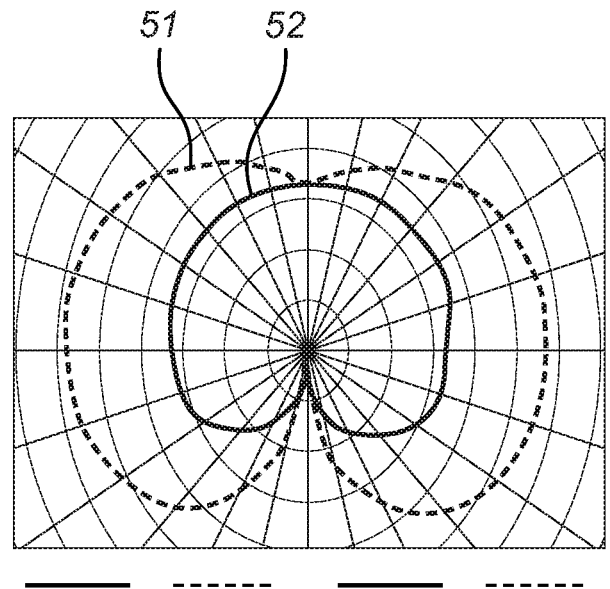
Figure 20D:
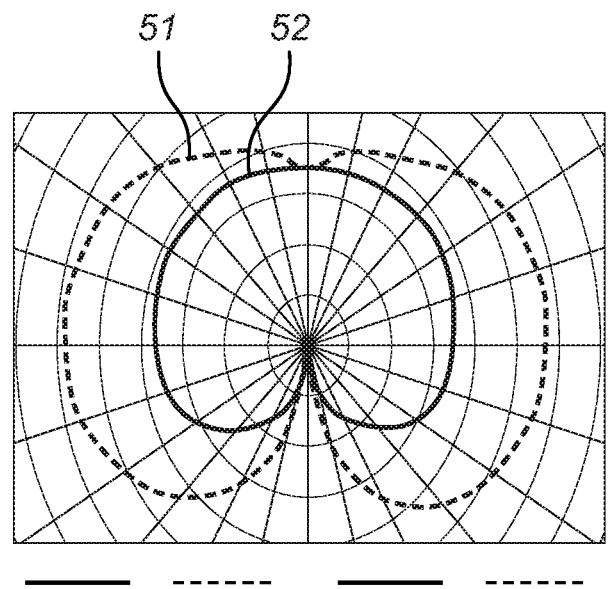
Figure 20E:
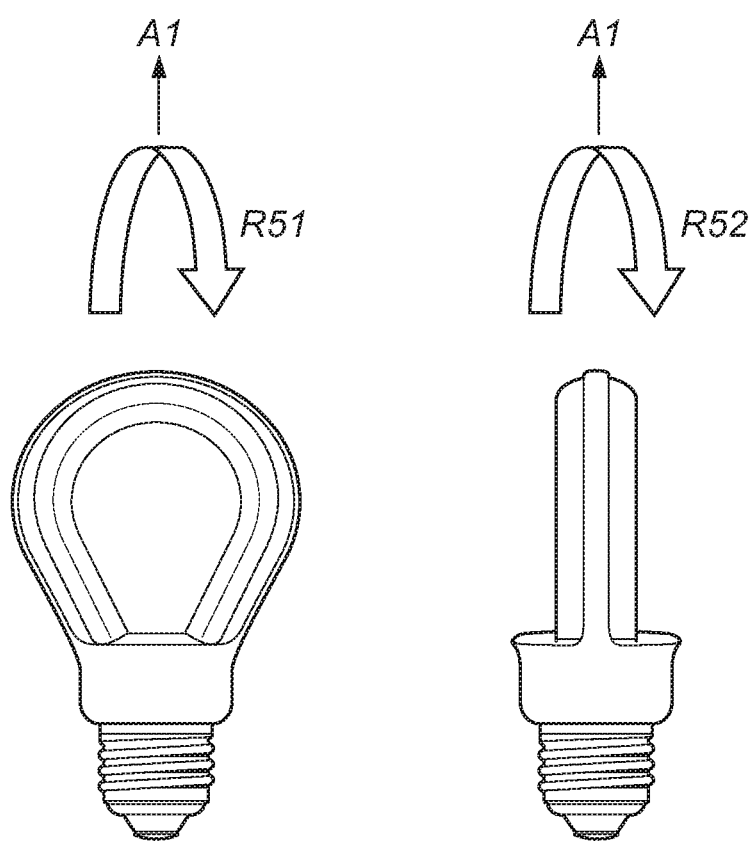

In FIG. 19C a cross sectional few is given of the scattering optics over the line III-III as given in FIG. 19A/B. On each side of the carrier 2 a scattering optics 47 protruding from this carrier 2 is positioned, thereby forming a cavity 48 in between the solid state light sources 3 and the scattering optics 47.

The scattering properties are determined by a number of parameters. In the first place the concentration of scattering particles. Starting with a transparent material like e.g. glass, PC or PMMA—adding of scattering particles will make this material translucent. By carefully tuning the scatter particle concentration the luminous intensity distribution can be adapted. Other parameters that are of influence on the luminous intensity distribution are the wall thickness 49 and shape of the scattering optics 47. By varying the concentration of the scattering particles and locally changing the wall thickness 49, the reflectance transmittance ratio of the wall can be locally changed. In this way, the desired luminous intensity distribution can be obtained. Further, amongst others, the shape of the scattering optics 47 can be adapted by changing the aspect ratio of the width and height.

In FIGS. 20A-D the luminous intensity distributions is shown that can be obtained by varying the concentration of scattering particles for a certain design of the wall. By way of example, in FIG. 20A the concentration is lowest, going up in the next figures, and being highest in FIG. 20D. The outer contour lines 51 indicate the luminous intensity distribution perpendicular to the plane of the lighting device 1, that is for a rotation around an axis in the plane of the carrier 2 and perpendicular to the axis A1 as indicated by the arrow with R51; the inner contour lines 52 indicate the luminous intensity distribution for a rotation around an axis normal to the plane of the carrier 2 and orthogonal to axis, denoted by arrow R52.

Figure 21A:
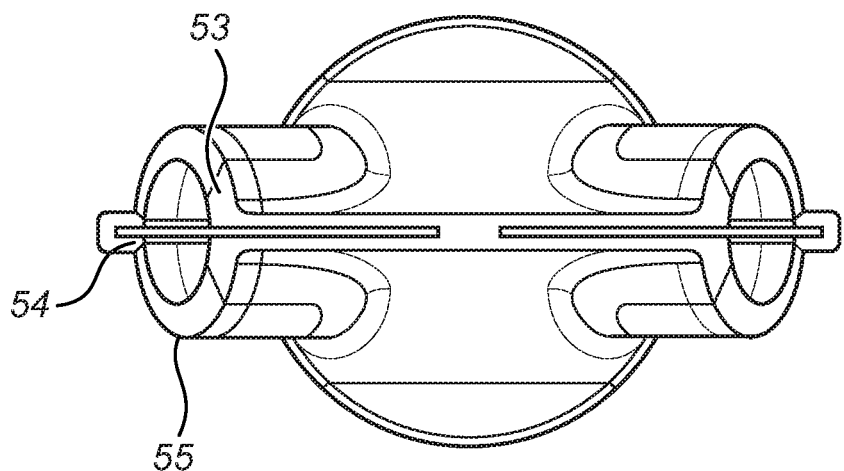
FIGS. 21A-D give different scattering optics with reflective portions.
Figure 21B:
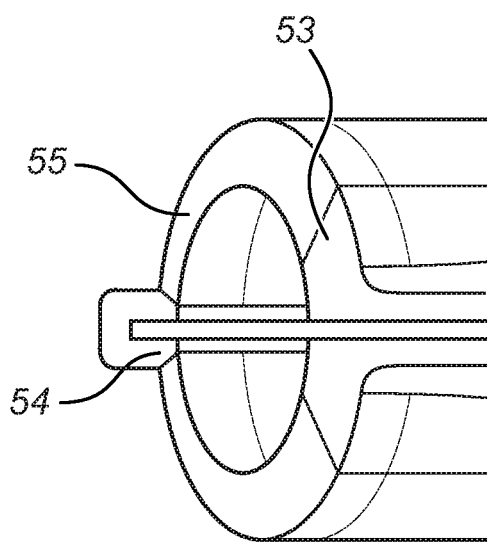

In another embodiment a part of the scattering optics 47 is made reflective. This reflective portion 53 may be on the inner side of the ring-shaped scattering optics 47 of which part 55 is translucent. In order to obtain a uniform light distribution, it is not required to emit a lot of light to the inside direction, because it may be shadowed by the opposite part of the scattering optics 47. Application of a reflective portion 53 on this part of the scattering optics 47 will lead to a higher optical efficiency. The reflective part may also be applied to the outer side 54 of the ring-shaped scattering optics 47 at the portion where the two cover parts meet. This is illustrated in FIG. 21A/B.

Figure 21C:
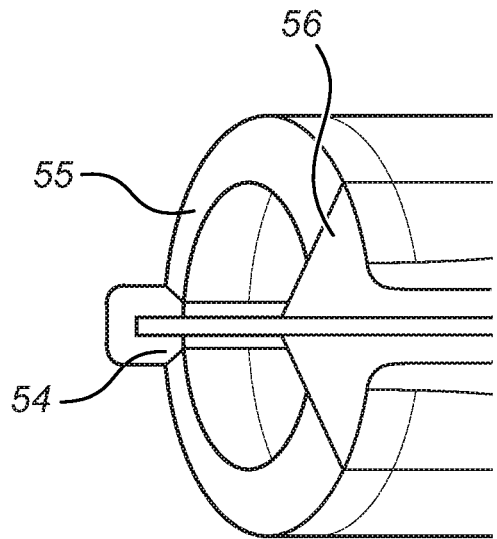

The optical efficiency may further be improved by extending the reflective part closer to the solid state light sources as indicated by the reflective part 56 in FIG. 21C.

Figure 21D:
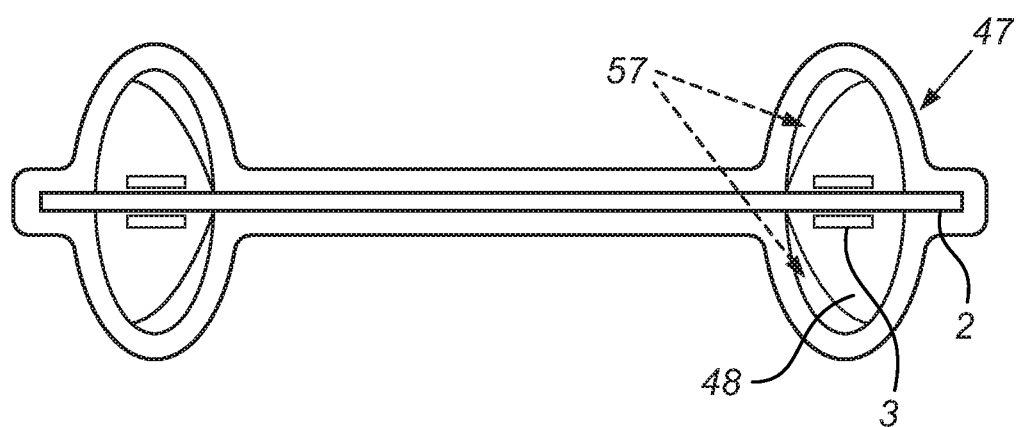
Figure 21E:
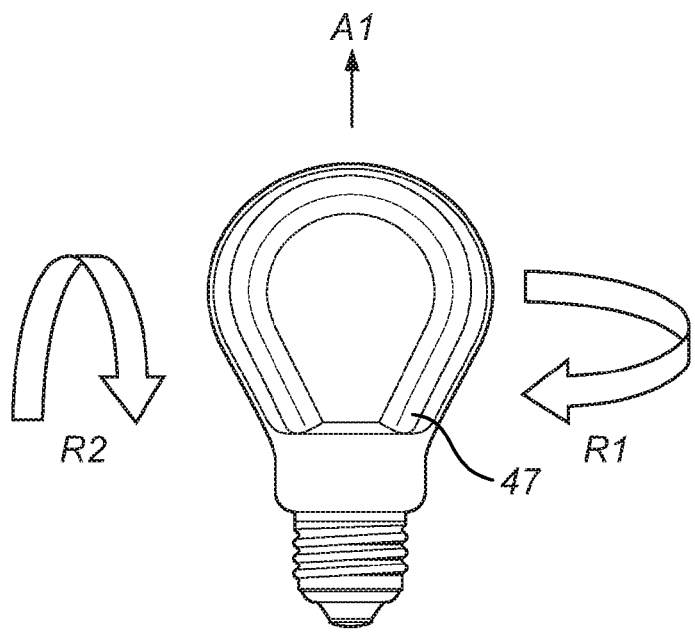
FIG. 21E/F give an embodiment of a lighting device according to the invention with a scattering optics and an EnergyStar compliant luminous intensity distribution.
Figure 21F:
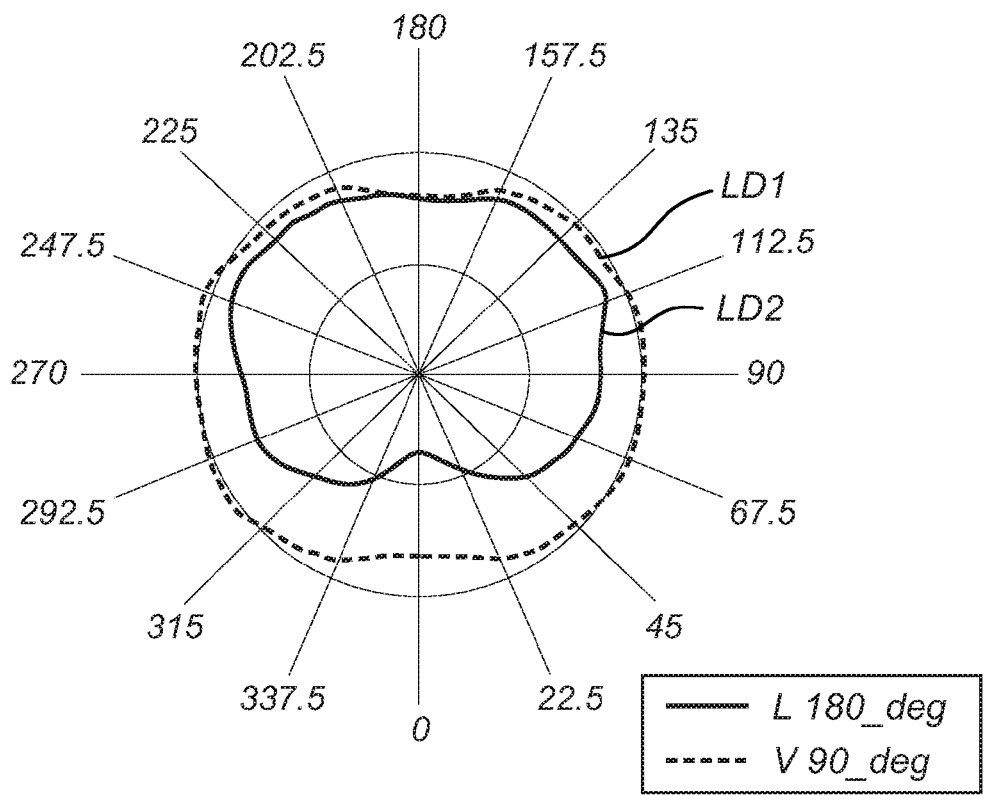

In yet another embodiment the scattering optics 47 could be made of almost equal or equal wall thickness which is advantages for injection molding. Part of the inside of the wall of the scattering optics 47 should be made reflective either by adding a reflective coating, reflective foil or separate (injection molded) reflective part 57. In FIG. 21D a cross section of the scattering optics 47 is shown. With this design it is possible to obtain an EnergyStar compliant luminous intensity distribution which is shown in FIG. 21F. FIG. 21E shows a front view of the lighting device with a scattering optics 47. The arrows indicate the direction for calculating the luminous intensity distributions LD1 and LD2 as shown in FIG. 21F.

The shape of the scattering optics 47 is not limited to the shapes illustrated in FIG. 19A/B. The scattering optics may be ring-shaped as in FIG. 19A, but it may also be a full circle; it may be horseshoe-shaped as in FIG. 19B where the outer ends extend in the direction of the cap 6. Other shapes that may be considered are for example, straight, a scattering optics 47 positioned on and following the outer edge or contour of the cover member 5a, 5b of the lighting device 1, and all types of scattering optics 47 that do not follow the outer edge or contour of the cover member 5a, 5b of the lighting device 1.

Figure 22:
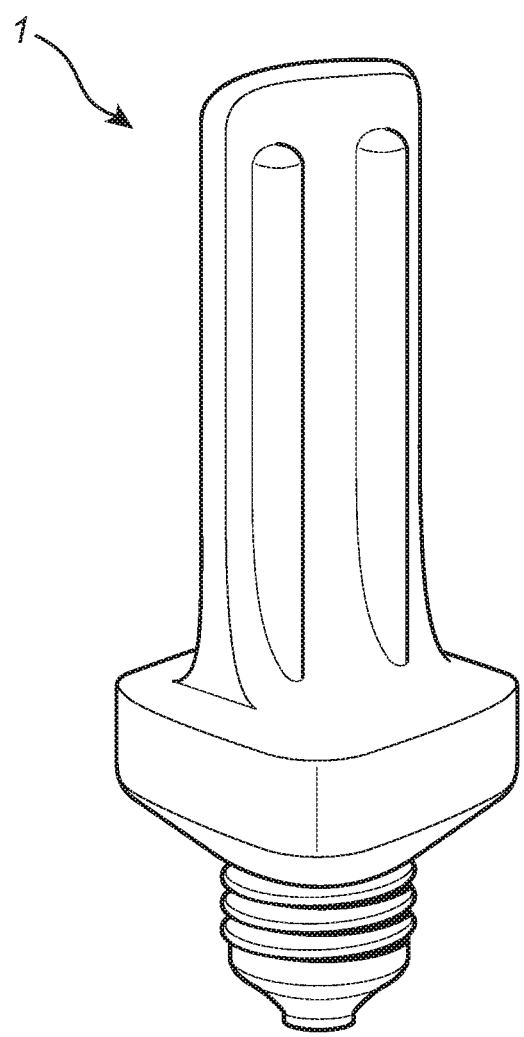
FIG. 22 gives a lighting device according to an embodiment of the invention.

All kind of outer contours of the lighting device 1 with a certain shape of scattering optics are within the inventive concept of the present invention. For instance, the lighting device 1 can have an outer shape like illustrated in FIG. 22, that can serve as a retrofit CFL lamp.

The lighting device 1 may comprise a controller adapted to control each of the at least one solid state light sources individually. The controller may be integrated in the carrier for the at least one solid state light source and may further contribute to the compact lighting device with few parts. The controller may further be adapted to control the light sources separately. Thereby, when the arrangement comprises a plurality of light sources, the controller may control the light sources to different color, different luminous intensity distribution etc. The different luminous intensity distribution may comprise different beam shapes of the light output from the light sources.

The person skilled in the art realizes that the present invention by no means is limited to the preferred embodiments described above. On the contrary, many modifications and variations are possible within the scope of the appended claims. For example, the shape of the carrier and cover member may be different, and the locations of the light sources may be optional. For instance, not only flat bulb shapes are possible, but any shapes desired such as square shapes, angled shapes or heart shapes.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

The invention claimed is:

1. A lighting device comprising:
   a solid state light source;
   a carrier on which said solid state light source is arranged, the carrier having a relatively large front side compared with its edge side, such that an amount of heat generated by the light source is transmitted into the carrier, the solid state light source being arranged on the front side of the carrier,
   a cover member disposed on the carrier and comprising a light-transmitting part, whereby the light source is arranged between the carrier and the light-transmitting part of the cover member, such that a thermal interface exists between the carrier and the cover member, said cover member having an outer surface being a portion of the outside of the lighting device and having an inner surface being opposite to the outer surface and being in thermal contact with the front side of the carrier, such that the thermal interface is formed,
   a connection member having a fixed position relative to the carrier for mechanically and electrically connecting the lighting device to a socket, wherein,
   the thermal interface is arranged to transmit there through a majority of the heat transmitted into the carrier from the light source,
   the light-transmitting part of the cover member comprising an optical structure adapted to direct emitted light from the solid state light source out of the lighting device, and
   wherein the lighting device has a longitudinal axis passing through the connection member and the carrier is positioned in parallel with the longitudinal axis.

2. The lighting device according to claim 1, wherein the cover member is formed of a transparent, translucent or tinted material and wherein the light transmitting part is formed as an integrated part of the cover member.

3. The lighting device according to claim 1, wherein the cover member is formed of a transparent, translucent or tinted material and wherein the light transmitting part is a separate part from the cover member.

4. The lighting device according to claim 1, wherein the optical structure comprises a lens, a light guide or a scattering optics.

5. The lighting device according to claim 1, further comprising at least an additional solid state light sources and associated additional optical structures.

6. The lighting device according to claim 1, wherein the optical structure is designed to provide a non-symmetric luminous intensity distribution.

7. The lighting device according to claim 1, further comprising:
   a second solid state light source arranged on a back side of the carrier being opposite to the front side,
   a second cover member disposed on the carrier, whereby the second light source is arranged between the carrier and a light-transmitting part of the second cover member, such that a thermal interface exists between the carrier and the second cover member,
   the second cover member having a second outer surface being a second portion of the outside of the lighting device and having a second inner surface being opposite to the second outer surface and being in thermal contact with the back side of the carrier, such that the second thermal interface is formed.

8. The lighting device according to claim 7, wherein the cover member and the second cover member are adapted to be attached to each other and to enclose the carrier.

9. A lighting device according to claim 7, wherein the light transmitting part of the second cover member comprises a second optical structure adapted to direct emitted light from the second solid state light source out of the lighting device.

10. The lighting device according to claim 9, wherein the second optical structure comprises a lens, a light guide or a scattering optics.

11. The lighting device according to claim 10, wherein the optical structure comprises a plurality of lenses, said lenses individually adapted to provide the lighting device with a uniform or regulation compliant luminous intensity distribution.

12. The lighting device according to claim 10, wherein the optical structure comprises a light guide having an inner contour with a curvature and an outer contour with a stoop 45.

13. The lighting device according to claim 12, wherein the light guide is adapted to provide the lighting device with a uniform or regulation compliant luminous intensity distribution.

14. The lighting device according to claim 10, wherein the optical structure is a scattering optics provided on the carrier, said scattering optics comprising a concentration of scattering particles, protruding from the carrier and having a wall thickness, thereby forming a cavity in between the solid state light sources and the scattering optics.

15. The lighting device according to claim 14, wherein the concentration of scattering particles, the cavity and the wall thickness are adapted to provide the lighting device with a uniform or regulation compliant luminous intensity distribution.

16. The lighting device according to claim 1, wherein said lighting device provides regulation compliant or a uniform luminous intensity distribution.

17. The lighting device according to claim 1, wherein the cover member comprises a protrusion adapted to extend through an opening in the carrier to align the carrier relative to the cover member.

18. The lighting device according to claim 1, further comprising a second carrier with a second front and back side positioned in parallel with the longitudinal axis and having at least one additional solid state light source arranged on the second front side.

19. The lighting device according to claim 18, wherein the second carrier is arranged in parallel with the carrier.

20. The lighting device according to claim 18, wherein the second carrier is arranged orthogonal relative to the carrier.

21. The lighting device according to claim 1, wherein the carrier is positioned transversally relative to a longitudinal axis of the lighting device.

22. The lighting device according to claim 1, wherein the lighting device has a longitudinal axis passing through the connection member and the carrier is a cylinder having an axis coinciding with the longitudinal axis.

23. The lighting device according to claim 1, wherein the carrier is a double-helical shaped surface positioned in parallel to a longitudinal axis of the lighting device.

24. The lighting device according to claim 23, wherein the double-helical surface has a first end pointing in the direction of the connection member, and a second end pointing away from said connection member, wherein the respective orientations of double-helical surface perpendicular to the longitudinal axis at the first end and at the second end differ by an angle that is in the range between 15° and 360°.

25. The lighting device according to claim 24, wherein the respective orientations differ by an angle that is in the range between 60° and 180°.

26. The lighting device according to claim 1, comprising the second solid state light source, wherein the lighting device comprises electrical connections for independently powering the solid state light source and the second solid state light source.

27. The lighting device according to claim 1, comprising the second solid state light source, wherein the lighting device comprises a controller for individually controlling the solid state light source and the second solid state light source.

28. A lighting device comprising:
a solid state light source;
a carrier on which said solid state light source is arranged, wherein the carrier has a relatively large front side compared with its edge side, such that an amount of heat generated by the light source is transmitted into the carrier, and the solid state light source is arranged on the front side of the carrier;
a cover member disposed on the carrier, whereby the light source is arranged between the carrier and a light-transmitting part of the cover member, such that a thermal interface exists between the carrier and the cover member, said cover member having an outer surface being a portion of the outside of the lighting device and having an inner surface being opposite to the outer surface and being in thermal contact with the front side of the carrier, such that the thermal interface is formed; and
a connection member having a fixed position relative to the carrier for mechanically and electrically connecting the lighting device to a socket, wherein,
the thermal interface is arranged to transmit there through a majority of the heat transmitted into the carrier from the light source, and
the lift-transmitting part of the cover member comprises an optical structure adapted to direct emitted light from the solid state light source out of the lighting device,
wherein the lighting device comprises a controller for individually controlling the solid state light source, and
wherein the lighting device has a longitudinal axis passing through the connection member and the carrier is positioned in parallel with the longitudinal axis.

* * * * *